United States Patent
Gao et al.

(10) Patent No.: US 9,401,724 B1
(45) Date of Patent: Jul. 26, 2016

(54) FREQUENCY SYNTHESIZERS WITH AMPLITUDE CONTROL

(71) Applicant: NXP B.V., Eindhoven (NL)

(72) Inventors: Yuan Gao, Eindhoven (NL); Frank Leong, Veldhoven (NL); Robert Bogdan Staszewski, Dublin (IE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/836,823

(22) Filed: Aug. 26, 2015

(51) Int. Cl.
| | | |
|---|---|---|
| *H03B 5/08* | (2006.01) | |
| *H03L 7/18* | (2006.01) | |
| *H03B 7/06* | (2006.01) | |
| *H03L 7/099* | (2006.01) | |
| *H03B 5/06* | (2006.01) | |
| *H03B 1/00* | (2006.01) | |

(52) U.S. Cl.
CPC .. *H03L 7/18* (2013.01); *H03B 1/00* (2013.01); *H03B 5/06* (2013.01); *H03B 5/08* (2013.01); *H03B 7/06* (2013.01); *H03L 7/099* (2013.01); *H03B 2200/004* (2013.01)

(58) Field of Classification Search
CPC .......... H03B 5/08; H03B 5/06; H03B 5/1212; H03B 5/1228; H03B 5/1265; H03B 5/1268; H03L 7/0891; H03L 7/099; H03L 7/06; H03L 3/00; H03L 2200/0094; H03L 2201/011; H03L 2201/012; H03L 2201/0266
USPC ........ 331/167, 1 A, 116 FE, 116 R, 182, 109, 331/117 R, 117 FE, 175; 327/156
See application file for complete search history.

(56) References Cited

U.S. PATENT DOCUMENTS

| 7,062,229 B2 * | 6/2006 | Dunworth | H03L 5/00 455/260 |
|---|---|---|---|
| 2015/0180414 A1 * | 6/2015 | Lee | H03B 7/06 327/157 |

OTHER PUBLICATIONS

J. Ryckaert et al., "A 0.65-to-1.4 nJ/Burst 3-to-10 GHz UWB All-Digital TX in 90nm CMOS for IEEE 802.15.4a." IEEE JSSC vol. 42, No. 12, pp. 2860-2869, Dec. 2007.
S. Drago et al., "A 200 uA duty-cycled PLL for wireless sensor nodes in 65 nm CMOS." IEEE JSSC, vol. 45, No. 7, pp. 1305-1315, Jul. 2010.
Andreani P., et al., "A TX VCO for WCDMA/Edge in 90 nm RF CMOS" IEEE JSSC, vol. 46, No. 7, Jul. 2011.
Chen, Y. et al., "A 9 GHz Dual-Mode Digitally Controlled Oscillator for GSM/UMTS Transceivers in 65 nm CMOS", IEEE Asian Solid-State Circuits Conference, Nov. 12-14, 2007; Jeju, Korea.

(Continued)

*Primary Examiner* — Arnold Kinkead
(74) *Attorney, Agent, or Firm* — Rajeev Madnawat

(57) ABSTRACT

A frequency synthesizer device provides amplitude control. Using switch circuit operating in a first mode, a charge voltage is applied to an oscillator circuit that an inductive-capacitive (LC) tank circuit. The LC tank circuit has a capacitive element, and an inductive element that is connected to the capacitive element. Using the switch circuit operating in a second mode, the LC tank circuit is enabled to oscillate. Using driver circuits that are response to a voltage applied to the tank circuit, current is reinforced in the LC tank, and the reinforcement is based upon a transconductance gain of the driver circuits. Using a calibration circuit, an amplitude of an output signal from the oscillator circuit is detected. In response to the detected amplitude, the transconductance gain is adjusted by enabling or disabling auxiliary circuits from plurality of auxiliary circuits.

13 Claims, 20 Drawing Sheets

(56) References Cited

OTHER PUBLICATIONS

Chillara V. K. et al., "An 860uW 2.1-to-2.7GHz All-Digital PLL-Based Frequency Modulator with a DTC-Assisted Snapshot TDC for WPAN (Bluetooth Smart and ZigBee) Applications", IEEE International Solid-State Circuits Conference, Session 9, 2014.

Fanori L. et al., "A Class-D CMOS DCO with an on-chip LDO", IEEE 2014.

Marucci G. et al., "A 1.7GHz MDLL-Based Fractional-N Frequency Synthesizer with 1.4ps RMS Integrated Jitter and 3mW Paoer Using a 1b TDC", 2014 IEEE International Solid-State Circuits Conference.

\* cited by examiner

FREQUENCY SYNTHESIZERS WITH AMPLITUDE CONTROL

OVERVIEW

Aspects of various embodiments are directed to frequency synthesizer circuits and to duty-cycled phase locked loop circuits.

Impulse Radio Ultra Wide-Band (IR-UWB) is an increasingly popular technique for radio frequency (RF) ranging. In IR-UWB radios, signals can be transmitted in the form of short pulses that make up a single impulse. The short pulses can be generated from short transmissions (or bursts) of a RF signal that is transmitted during the impulse. The burst duration is on the order of nanoseconds while the pulse repetition rate of the RF signal is on the order of microseconds. Low duty cycle can be exploited in the local oscillator to achieve low power consumption by keeping the oscillator active only during the existence of a pulse. When operating an oscillator in duty-cycled mode, the startup time of the oscillator, compared to the burst duration, as well as the accuracy of the startup phase becomes important. Ring oscillators can be designed in such a way to meet the above two requirements, while LC oscillators generally feature a long startup time in addition to an undetermined (randomly set) startup phase. Due to this, ring oscillators have been used in IR-UWB radios.

These and other matters have presented challenges to efficiencies of frequency synthesizer implementations, for a variety of applications.

SUMMARY

Various embodiments are directed toward a frequency synthesizer device with amplitude control. The frequency synthesizer device includes an oscillator circuit that has an inductive-capacitive (LC) tank circuit. The LC tank circuit includes a capacitive element, and an inductive element that is connected to the capacitive element. Driver circuits are configured to reinforce oscillation to generate output signal that oscillates in response to voltage applied to the tank circuit and a transconductance gain provided to the oscillator circuit. A switch circuit is configured to operate in a first mode in which the capacitive element of the oscillator circuit is held at a charge voltage that corresponds to a supply voltage and in a second mode in which the tank circuit oscillates. A plurality of auxiliary circuits are each configured to adjust, in response to being enabled, an amplitude of the output signal by changing the transconductance gain provided to the oscillator circuit. A calibration circuit is configured to detect an amplitude of the output signal, and adjust, in response to the detected amplitude, how many of the plurality of auxiliary circuits are enabled.

Embodiments are directed toward a method for use with frequency synthesizer device with amplitude control. Using switch circuit operating in a first mode, a charge voltage is applied to an oscillator circuit with an inductive-capacitive (LC) tank circuit. The LC tank circuit has a capacitive element, and an inductive element that is connected to the capacitive element. Using the switch circuit operating in a second mode, the LC tank circuit is enabled to oscillate. Using driver circuits that are responsive to a voltage applied to the tank circuit, current is reinforced in the LC tank, and the reinforcement is based upon a transconductance gain of the driver circuits. Using a calibration circuit, an amplitude of an output signal from the oscillator circuit is detected. In response to the detected amplitude, the transconductance gain is adjusted by enabling or disabling auxiliary circuits from plurality of auxiliary circuits.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
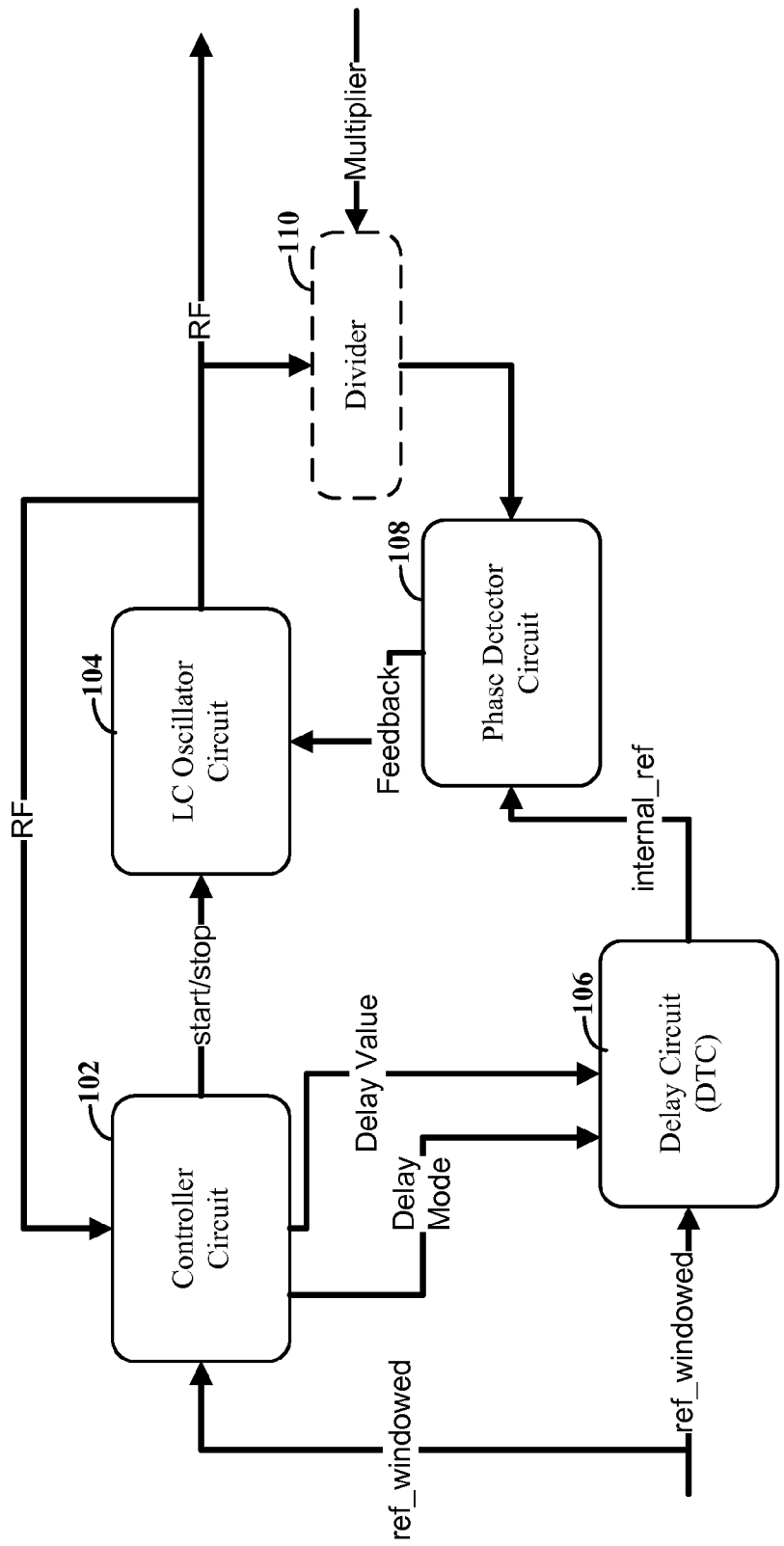
FIG. 1 depicts a block diagram of a frequency synthesizer circuit that can be used with a duty-cycled oscillator circuit, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving frequency synthesizers that use configurable delay circuits. In certain implementations, aspects of the present disclosure have been shown to be beneficial when used in the context of digital phase locked loop circuits with duty-cycled oscillator circuits. In some embodiments, the oscillator circuit is an LC oscillator circuit with near instantaneous startup characteristics. These and other aspects can be implemented to address challenges, including those discussed in the background above. While not necessarily so limited, various aspects may be appreciated through a discussion of examples using such exemplary contexts. In some instances, well known features have not been described in detail so as not to obscure the description of the examples herein. For ease of illustration, the same reference numerals may be used in different diagrams to refer to the same elements or additional instances of the same element.

Aspects of the present disclosure recognize that a digital approach to PLLs and FLLs can scale well with technology and also benefit from emerging techniques, and thus, allow for the implementation of a duty-cycled PLL with an all-digital phase-locked loop (ADPLL) structure.

Particular embodiments are directed toward an oscillator that operates in duty-cycled mode, therefore enjoying the low power advantage. Various embodiments also allow for the cancellation of initial offset and for fractional support, while requiring little additional power. Various embodiments of the present disclosure are directed toward applying an ADPLL to a duty-cycled PLL to provide a system architecture that is expected to be extendible for use with future ADPLLs and related techniques.

Embodiments of the present disclosure are directed toward a frequency synthesizer circuit that is configured to generate a radio frequency (RF) signal from a frequency reference (FREF) clock. The frequency synthesizer circuit can be configured to set the frequency of the RF signal according to a desired multiplier ratio relative to the FREF clock. The frequency synthesizer circuit can also be configured to align the phase of the RF signal with the phase of the FREF clock. In particular embodiments, the frequency synthesizer circuit is implemented using an oscillator circuit configured to operate in duty-cycled modes and using a digital phase locked loop (PLL) circuit or a digital frequency locked loop (FLL) that can be phase aligned to the FREF clock. For example, digital in the context of either a PLL or FLL circuit can include the use of a digital loop filter.

Consistent with various embodiments, the frequency synthesizer circuit can include an inductive-capacitive (LC) tank oscillator circuit (or just "LC tank") configured to generate the RF signal. In particular embodiments, the LC tank can be configured for use in duty-cycled modes that provide fast startup with a known phase orientation. According to various embodiments, the duty-cycled modes can be accomplished using a switching circuit that can pre-charge the capacitor while preventing oscillation by blocking the current flow between the capacitor and inductor.

The frequency synthesizer circuit can include a digital-to-time converter (DTC) circuit that is configured to operate, for a first edge of a windowed version of the FREF clock (ref_windowed), in a baseline mode that introduces a first delay. For a subsequent edge of ref_windowed, the DTC circuit can operate in a delay mode that introduces a second delay value to ref_windowed. This second delay can be larger than the first delay by a value that is based upon the frequency multiplier ratio. In particular, the delay value can be set to correspond to (relative to the baseline delay value) a fractional cycle for a non-integer portion of the multiplier ratio for the frequency synthesizer circuit. By switching between the two modes, the fractional cycle can be inserted relative to subsequent edges of ref_windowed. The resulting output of the DTC circuit can be used for sampling the RF signal as well as being compared with a delayed version of the RF signal.

In embodiments, a controller circuit can be configured to control the modes of the LC oscillator circuit by enabling oscillation of the LC oscillator circuit in response to a first edge of the FREF clock. For instance, the first edge can correspond to an edge that occurs at the start of a window for a windowed version of the FREF clock. The controller circuit can also be configured to set the delay value for the delay mode as a function of the frequency of the RF signal. In particular, the controller circuit can determine the delay value based upon the non-integer portion of the multiplier ratio for the frequency synthesizer circuit. A phase detector circuit can be configured to detect, for the subsequent edges of the FREF clock and with the delay of the DTC circuit, a phase error between FREF clock and RF signal.

Various embodiments are directed toward amplitude calibration of an oscillator circuit to keep the oscillation amplitude constant over a wide range of frequencies. In particular, the amplitude is kept constant by providing voltage biasing to the oscillator and further adjusting the effective transconductance seen by the LC tank within the oscillator circuit.

In particular embodiments, amplitude calibration can be accomplished using a device that is configured to be used with an oscillator circuit that includes an inductive-capacitive (LC) tank circuit with both a capacitive element and an inductive element that are connected. The oscillator circuit also includes inverter circuits that have a transconductance gain and that are configured to generate an output signal that oscillates in response to the voltage applied to the tank circuit. A switch circuit can be configured to operate in a first (precharge) mode in which the capacitive element of the oscillator circuit is held at a pre-charged voltage that corresponds to a supply voltage, and in a second (running) mode in which the tank circuit is allowed to oscillate.

According to embodiments, a plurality of auxiliary circuits are each configured to adjust, in response to being enabled, an amplitude of the output signal by contributing and adjusting the effective transconductance gain seen by the LC tank. As used herein, the effective transconductance gain of the inverter circuits represents the effective gain in view of external biasing. Thus, the effective transconductance gain of the inverter circuits, as seen by the LC tank, can be adjusted separate from the actual transconductance gain of the individual inverter circuits and their corresponding transistors. For instance and as described in more detail herein, the auxiliary circuits can be external to, but also connected to, the oscillator and its inverter circuits. These auxiliary circuits can provide voltage biasing to the oscillator circuit. A calibration circuit can be configured to detect an amplitude of the output RF signal from the oscillator circuit. In response to the detected amplitude, the calibration circuit can be configured to adjust the number of the plurality of auxiliary circuits that are enabled and thereby control the voltage biasing. As discussed in more detail herein, the calibration process can be integrated with a frequency locking process of circuit to facilitate duty cycle operation of the oscillator with fast frequency locking capabilities.

Various embodiments are directed toward a frequency synthesizer that is configured for use with an LC digitally controlled oscillator (DCO) that features (near) instantaneous startup behavior. For instance, the LC-DCO can be configured to operate in a pre-charge mode where the LC oscillator is frozen in a state where all the energy is stored in the capacitor bank in electrical form. This state is one of the valid states of the LC oscillator, where, in this specific state, there is no current in the inductor. Accordingly, no energy loss occurs in the inductor due to series resistance. The switch circuit prevents current from flowing through the inductor(s) until a control signal ("start/stop") arrives. From that moment on, the oscillator can enter into a running mode (steady state) almost instantaneously. For example, a differential tank voltage of the oscillator tuned to frequencies in the range of about 5 to 7 GHz has been shown to exhibit a nearly instantaneous frequency settling of the oscillator. It is noted, however, that different frequency ranges of oscillation can be provided by using such an LC-DCO.

Turning now to the figures, FIG. 1 depicts a block diagram of a frequency synthesizer circuit that can be used with a duty-cycled oscillator circuit, consistent with embodiments of the present disclosure. The frequency synthesizer circuit can be configured to receive a reference clock signal (FREF clock) or a windowed version of a reference clock (ref_windowed) and to produce an RF signal based upon a desired frequency multiplier ratio. As discussed herein, the FREF clock can be windowed or duty cycled before being provided to the circuit of FIG. 1 (as indicated by the signal name "ref_windowed"). For ease of discussion and unless expressly stated otherwise, the term FREF clock is used synonymously with the windowed version of the reference clock signal. The presence of the windowed FREF clock (ref_windowed) can therefore be used to initiate the generation of the RF signal. Controller circuit 102 can be configured to respond to the presence of the windowed FREF clock by generating an enable signal ("start/stop") that is then provided to the LC oscillator circuit 104. For instance, the enable signal can be generated in response to detecting a first edge (positive or negative) of the windowed FREF clock. As discussed herein, the LC oscillator circuit 104 can be configured to provide fast startup (relative to steady state operation) with a known phase orientation. This can facilitate the ability to quickly begin locking to the desired frequency.

Delay circuit 106 can be configured to operate in two different modes in order to provide frequency locking to the desired non-integer frequency multiplier ratio. The first mode provides a first delay value that is different from the delay value of the second. In some embodiments, the first (pass-through or baseline delay setting) mode can provide a (near) zero delay to the FREF clock. For ease of discussion, the first mode is sometimes discussed in terms of a baseline or zero delay mode; however, different delay values are possible for the first mode. In the second (delay) mode, the delay circuit 106 can introduce an additional (relative to the delay of the first mode) programmable delay to the FREF clock to produce an internal reference clock (internal ref) that can be used by the frequency synthesizer circuit. According to various embodiments, the controller circuit 102 can program the delay value to correspond to the fractional component of the non-integer frequency multiplier ratio. In particular, the delay value can be increased, relative to the first mode, by a delay amount that equals the fractional component of the frequency multiplier ratio. Accordingly, by switching from the baseline mode to the delay mode during a cycle of the FREF clock, the delay circuit 106 can output a clock cycle that is extended by the fractional portion of the frequency multiplier ratio.

Phase detector circuit 108 can be configured to detect a timing difference between the delayed FREF clock and the RF signal. In particular embodiments, this can be a single bit (early or late) detection. The result of the phase detection can be used to provide a feedback to the LC oscillator circuit 104 for adjustment of the frequency of the RF signal. Consistent with various embodiments, the phase detection can be a single bit detection.

Consistent with certain embodiments, the frequency synthesizer circuit can include a frequency divider circuit 110. The divider circuit 110 can be configured to generate a divided version of the RF signal. The amount of the division can vary based upon the particular design (e.g., based upon the RF signal frequency range).

Figure 2:
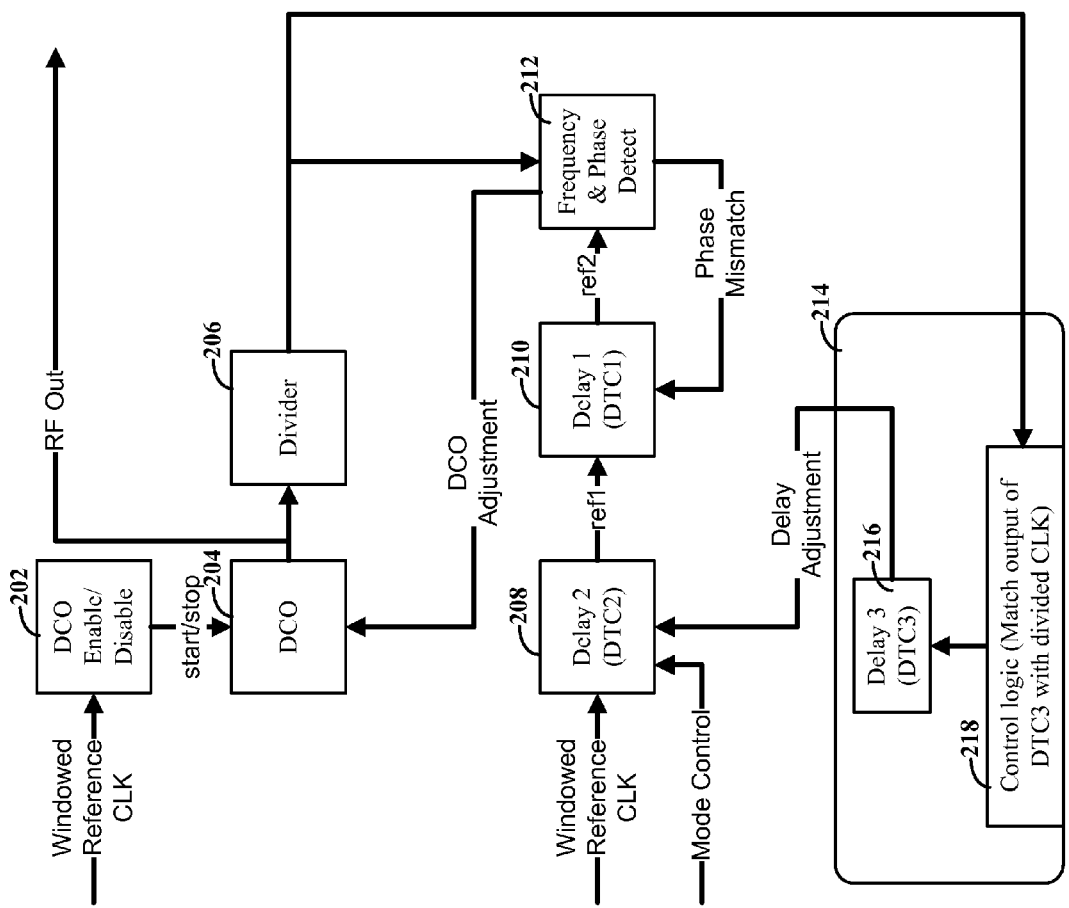
FIG. 2 depicts a block diagram for a frequency synthesizer circuit with a calibration delay circuit, consistent with embodiments of the present disclosure.

FIG. 2 depicts a block diagram for a frequency synthesizer circuit with a calibration delay circuit, consistent with embodiments of the present disclosure. As discussed herein, the FREF clock can be windowed so that it has both active and inactive states (e.g., to support a burst mode for RF communications). Consistent with embodiments, the frequency synthesizer circuit can be configured with two different paths. In the first path, the windowed FREF clock is received at an enable circuit 202. In response to the presence of the windowed FREF clock (indicating the start of a burst), the enable circuit 202 can generate a start/stop signal (start/stop). The start/stop signal can then be used to start the digitally controlled oscillator (DCO) circuit 204. The start/stop signal can also be used to stop the DCO circuit 204 after the burst is completed, which can be after a set time or number of clock cycles. As discussed herein, the DCO circuit can be an LC-DCO that features (near) instantaneous startup behavior.

The DCO circuit can produce an RF signal (RF_OUT) that has a frequency that corresponds to a desired frequency multiplier ratio as applied the FREF clock, which can be used by the system. For instance, the frequency synthesizer circuit can be used in connection with a RF transmitter (or receiver) circuit and the RF signal can be used as the carrier for the transmitted signal. According to embodiments, the frequency of the RF signal can be a non-integer multiple of the frequency of the FREF clock. Divider circuit 206 can be used to produce a divided version of the RF signal for comparison with the frequency/phase of ref_windowed. In this manner, the divider circuit 206 can represent, at least a portion of, the integer part of the frequency multiplier ratio.

In the second path, a number of delays are introduced to the FREF clock before the resulting signal is used for comparison with the RF signal from the DCO circuit. Delay circuit 208 can be configured to operate in two modes. In a baseline mode, delay circuit 208 is configured with zero delay or a baseline delay that corresponds to a low (or lowest) delay for the delay circuit 208. In the second/delay mode, the delay circuit 208 can be configured to introduce a delay that corresponds to the non-integer portion of the frequency multiplier ratio. By alternating between these modes between subsequent clock cycles, the delay circuit can add the non-integer portion of the frequency multiplier ratio to the output "ref1" signal to lengthen the clock period of the ref1 signal by a corresponding amount.

Delay circuit 210 can be configured to provide an adjustable delay that is designed to compensate for timing delays resulting from circuit components in both the first and the second paths. These timing delays may not be determinable prior to use of the circuit (e.g., due to manufacturing variances in components, changing operating conditions, or other factors). The output (ref2) from delay circuit 210 can then be used to detect a phase mismatch between ref_windowed and the RF signal using a phase detector circuit 212. In certain embodiments, phase detector circuit 212 can be implemented using a single bit bang-bang type detector. Consistent with the discussion of FIG. 3, divider circuit 206 can operate as a pre-scaler and the phase detector circuit 212 can be configured to include a counter 318 and sampler circuit 320. Other configurations and types of phase detection circuits are also possible.

Consistent with embodiments, control circuit 214 can set the delay value for the delay circuit 208. The delay value can be calculated by control logic 218, which can implement a gain calibration algorithm that adjusts the delay value of delay circuit 216 to account for the gain and intrinsic delays of the DTC circuits. The gain value of delay circuit 216 can then be used in order to calculate the delay value for the delay circuit 208 in order to choose the appropriate control word.

Figure 3A:
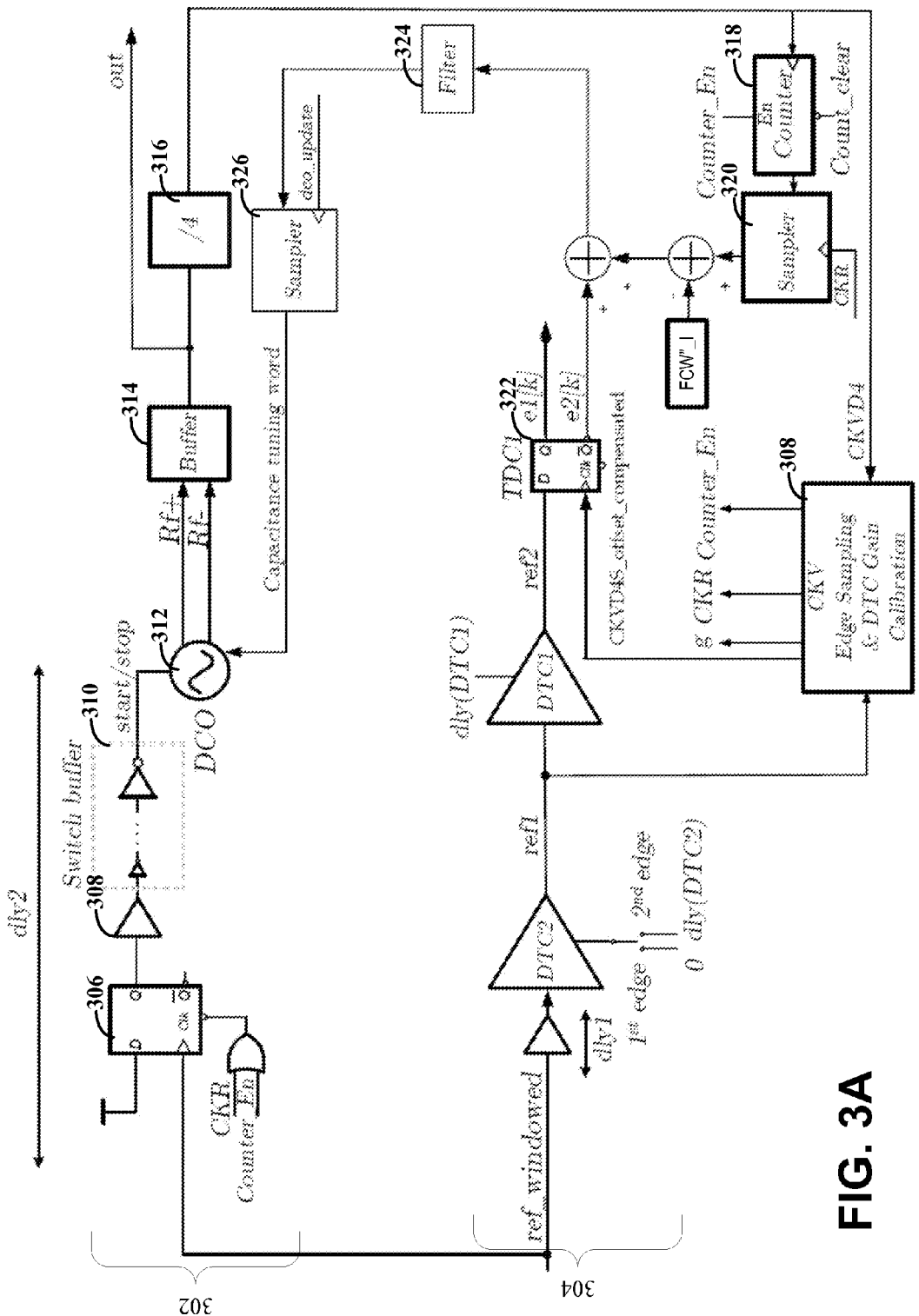
FIG. 3A depicts a circuit diagram illustrating the locking principle of a frequency synthesizer circuit, consistent with embodiments of the present disclosure.

FIG. 3A depicts a circuit diagram illustrating the locking principle of a frequency synthesizer circuit, consistent with embodiments of the present disclosure. As discussed herein, the frequency synthesizer circuit can be designed for use with an instantaneous-startup oscillator and can operate in a duty-cycled mode. The circuit diagram of FIG. 3A shows a loop (split into two paths) that is responsible for locking the RF signal (or "CKV") to the frequency of the reference clock ("FREF"). The frequency synthesizer circuit can be configured to receive a windowed version of the FREF clock ("ref_windowed"). The windowing can correspond to a burst window for data transmissions (e.g., IR-UWB radios).

The top path 302 can include an enable circuit 306 that is configured to trigger the DCO 312 (using the "start/stop" signal) in response to receiving the windowed FREF clock ("ref_windowed"). The enable circuit 306 is shown as a D flip-flop that is set in response to the first rising edge of ref_windowed within a burst and reset by signal(s) from the OR gate due to a falling edge of the CKR signal. While certain examples are discussed in the context of rising or falling edges, it is recognized that a different edge can be used in many instances. The converse example is not expressly discussed in every instance for the sake of brevity.

The buffer 310 serves to strengthen the signal from 306 in order to directly drive the start/stop mode of the DCO circuit 312, which can require a signal with a relatively strong driving capability. DCO 312 can adjust the frequency of the RF signal in response to an input capacitive tuning word signal. The RF signal can be buffered by buffer circuit 314 and used as an output of the frequency synthesizer circuit. Divider circuit 316 can produce a divided version of the RF signal that can be used as a feedback to lock the frequency synthesizer circuit to the FREF clock. While FIG. 3A shows divider circuit 316 as a divide-by-four circuit, the divider circuit could divide by other numbers, or no divider circuit could be used. The particular setting can be selected based upon the design parameters, such as the frequency difference between the FREF clock and the RF signal or simply the highest tolerable frequency to operate counter 318.

The bottom path 304 can be configured for use as a reference phase to be compared with the RF signal. DTC2 represents a digital-to-time converter circuit that can operate in two different modes. As discussed in more detail herein, a first mode can be a baseline mode in which there is no added delay, and a second mode can be a delay mode in which a fractional cycle can be added to the output ("ref1"). For instance, DTC2 can be set to baseline mode for a first clock edge of the ref_windowed clock and then set to a delay mode for a subsequent, second clock edge. The additional delay to the second clock edge can be particularly useful for maintaining the timing relationship between the clock edges of the ref_windowed clock and the RF signal (e.g., to support the fractional operation and to avoid metastability issues). As discussed herein, the controller circuit 308 can be configured to use a "dummy" DTC circuit ("DTC3") from which the delay characteristic (or, more precisely, the gain) of DTC2 can be estimated.

Consistent with the discussion of FIG. 1 and elsewhere, the controller circuit can be configured to provide a variety of different functions. For example, the circuitry (306, 310) for generating and buffering/strengthening the start/stop signal can be considered part of a controller circuit, as can aspects of inner/outer-loop finite state machines (FSMs), discussed in more detail herein.

DTC1 can also be configured to introduce a controllable delay. The controller circuit 308 can be configured to adjust the delay so that it corresponds to timing delays resulting from circuits in the first path, such as delays introduced by the divider circuit 316. In certain embodiments, controller circuit 308 can receive ref1 and the divided RF signal (CKVD4) as inputs and use these signals to determine the delay value for DTC1. This allows for the alignment of the first edge of ref2 with the first edge of CKVD4S_offset_compensated based upon feedback from e1[k].

Counter circuit 318 can be configured to count the number of edges for the divided RF signal (CKVD4) in response to an enable signal (Counter_En) that is generated by the controller circuit 308. Sampler circuit 320 can be configured to store the output of the counter circuit 318 at a time determined by the controller circuit. The counter value is compared with the integer portion of the frequency control word (FCW"_I), as adjusted for consistency with CKVD4 (e.g., FCW"_I=floor (FCW/4)). The comparison (e.g., subtraction) is used to produce a feedback signal.

Time-to-digital converter (TDC1) 322 provides a single-bit comparison of the phase of the divided RF signal to the phase of the FREF signal. The result of the comparison is combined with the feedback from the sampler circuit 320 and used to adjust the DCO 312. In certain embodiments, the feedback can be filtered (e.g., using a low pass filter or other filter circuit 324) and sampled 326 (periodically or otherwise in response to control signal dco_update) so that the capacitance tuning word for the DCO 312 is updated at discrete intervals (as opposed to continuously updated).

The two variable delays, dly1 and dly2, are inserted at the top and the bottom paths. These variable delays can be used to bias the Slack variable (discussed hereafter) towards either positive or negative directions. In some embodiments, the Slack variable only needs to be biased towards one of the two directions, therefore one of the variable delays can be eliminated. For example, the frequency synthesizer circuit could be designed with only dly2 being implemented at the hardware level.

Figure 3B:
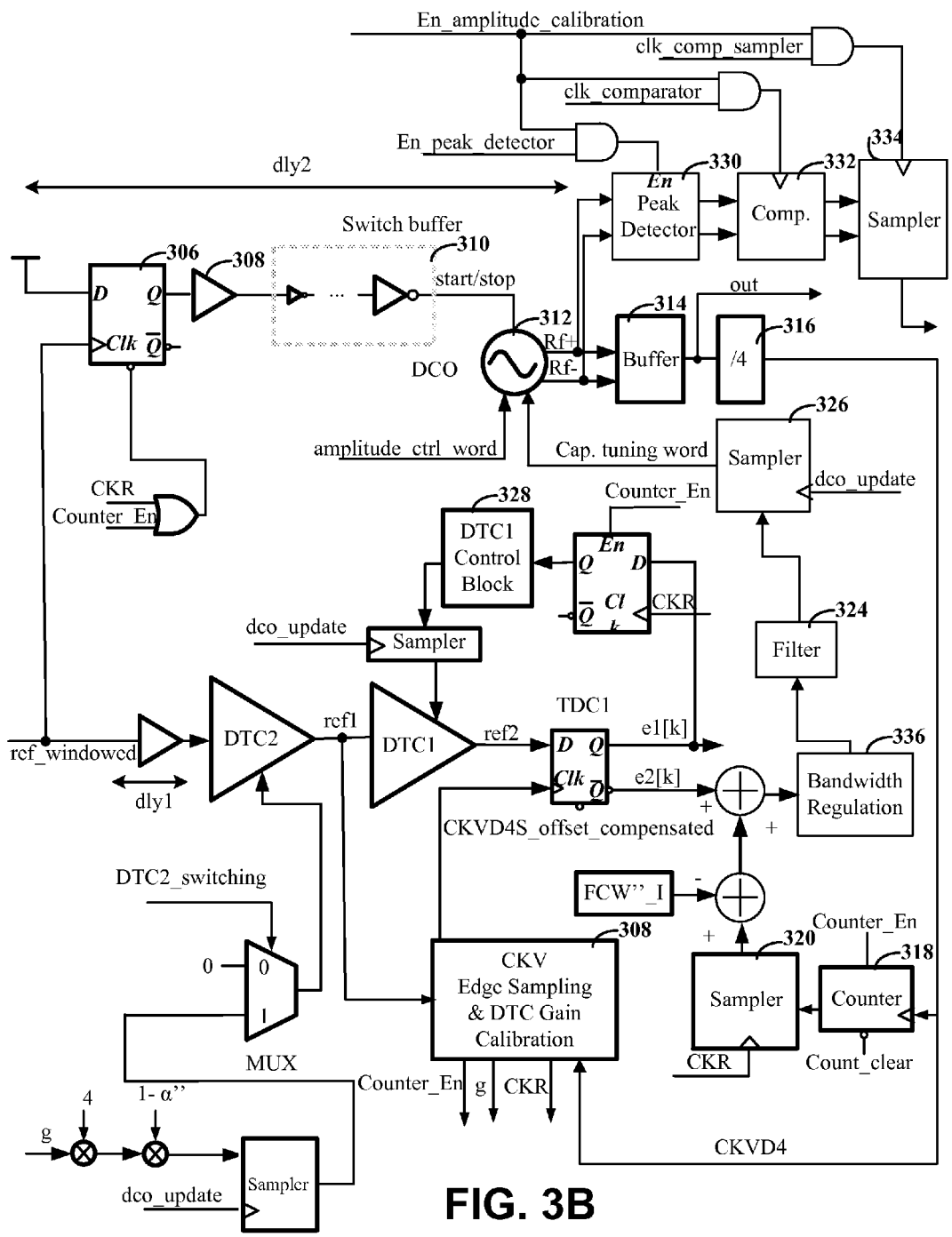
FIG. 3B depicts a particular circuit diagram illustrating locking principle of a frequency synthesizer circuit, consistent with embodiments of the present disclosure.

FIG. 3B depicts a particular circuit diagram illustrating additional circuit details for a frequency synthesizer circuit, consistent with embodiments of the present disclosure. FIG. 3B includes additional details for an example consistent with the circuit diagram of FIG. 3A. For example, DTC1 control block circuit 328 is depicted in FIG. 3B. This control block circuit can be configured to control the DTC1 delay time in order to align the first edge of ref2 with an edge of CKVD4S_offset_compensated based on the feedback provided e1[k].

Figure 16:
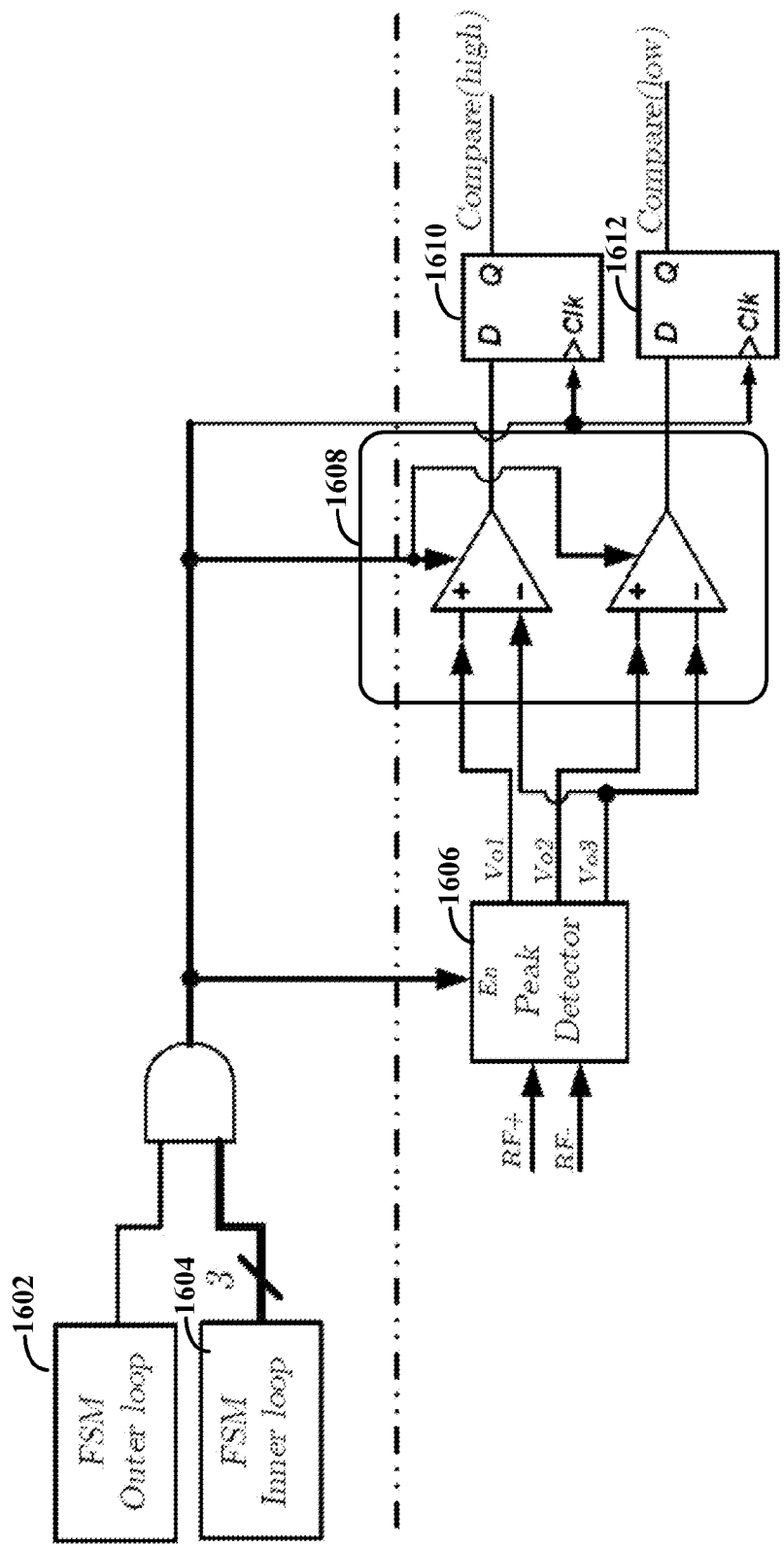
FIG. 16 depicts an amplitude detection circuit for performing amplitude calibration, consistent with embodiments of the present disclosure.

Peak detector circuit 330, comparator circuit 332, and sampler circuit 334 can be used to generate amplitude comparison signals (high and low), consistent with the discussion of FIG. 16 and the corresponding circuit diagram.

Bandwidth regulation circuit 336 can be configured to change the step size for the frequency compensation updates. This can increase locking speed without compromising the accuracy after locking. The frequency of the RF signal is roughly estimated through the result of the counter; however, when the residual frequency difference between the RF signal and the desired frequency is small enough, the counter can reach a dead region. The remaining locking process can be accomplished using the output of the phase detector; however, the depicted phase detector is only a single bit and does not contain information about the amount of the residual frequency difference. Accordingly, the bandwidth regulation circuit 336 can adjust the step size in response to determining, for example, that a previous set overcompensated for the residual frequency difference and thereby increase the locking speed.

A number of different signals are depicted in FIG. 3B. Some of these signals can be generated by finite state machines corresponding to inner and outer loop control circuits (not shown). The FREF clock can be used to drive the outer-loop FSM as well as many of the other digital blocks. In certain embodiments, this reference clock can be generated from an off-chip crystal oscillator (e.g., running at 25 MHz in an example). A brief description for some of the signals is provided as follows.

Count_clear can be provided by the outer-loop FSM that can be used to clear the CKV counter 318. In particular, the counter can be cleared after one burst and before the next one. For example, the Count_clear signal can reset the counter after the update of the DCO finishes. The Count_clear signal can also be used to reset some other blocks such as the divider and the edge-sampling circuitry.

The DTC2_switching signal can be provided by the outer-loop FSM circuit. The signal allows the delay of DTC2 to be different between the 1st and 2nd rising (or falling) edge of the ref_windowed signal. In particular, the control word of DTC2 can be changed from near zero to a value corresponding to a fractional part of the frequency multiplier ratio at the 1st falling (or rising) edge of the ref window signal.

The DTC_gain_update signal can be provided by the outer-loop FSM circuit. The signal can trigger updating for the estimated gain value for the DTCs, which can occur after each burst, following the bandwidth update of the correlator.

The En_peak_detector signal can be provided by the outer-loop FSM circuit. The En_peak_detector signal can specify the window in which the peak detector circuit is active. For instance, the peak detector can be turned on before the burst begins and turned off after the burst ends, so that the switching does not cause interference to the RF signal. While the En_peak_detector signal specifies the position of the window, the peak detector circuit is also controlled by another control signal from the inner-loop FSM, En_amplitude_calibration, which specifies whether the PLL is in the amplitude calibration phase.

The clk_comparator signal can be provided by the outer-loop FSM circuit. The clk_comparator signal can be used to trigger the clocked comparator 332 to compare the results from the peak detector. The rising edge of clk_comparator can occur after the beginning of the burst (e.g., 20 ns later), which can place a design constraint on the settling time of the peak detector.

The clk_comp_sampler signal can be provided by the outer-loop FSM circuit. The rail-to-rail results from the comparator 332 are sampled at the rising edge of the clk_comp_sampler signal, which can be configured to arrive a set amount of time (e.g., 20 ns) after the rising edge of the clk_comparator signal, which can place a constraint on the settling time of the comparator output.

Figure 4:
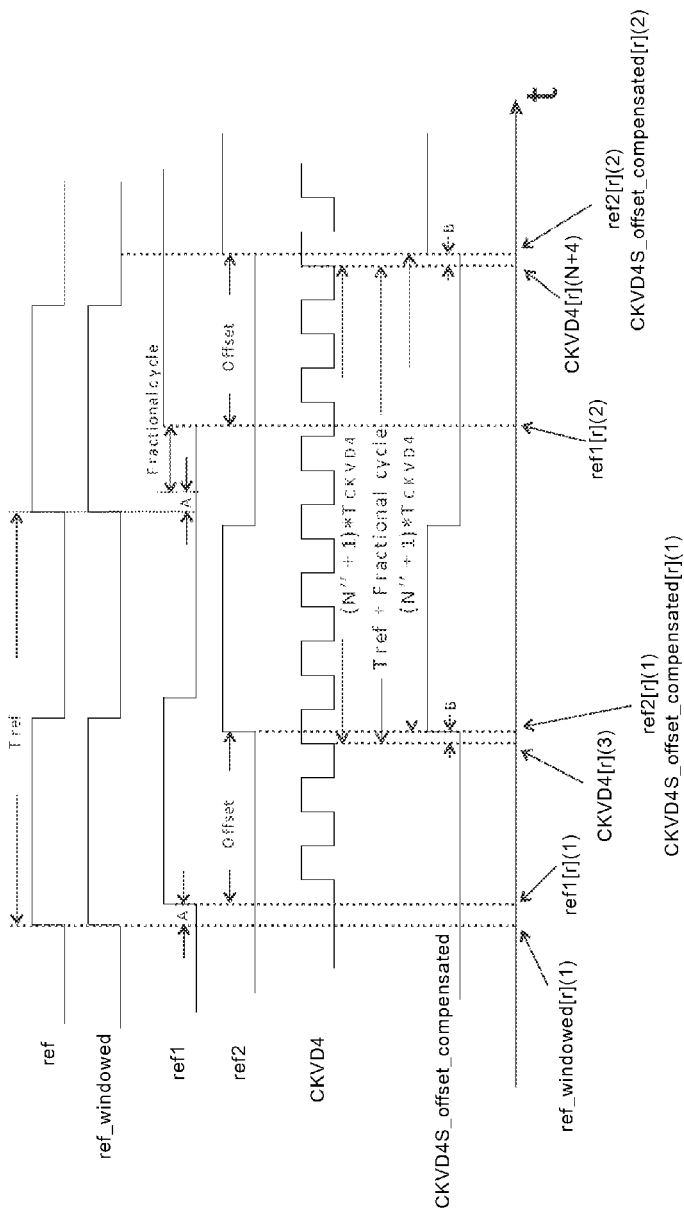
FIG. 4 depicts a signal timing diagram for the frequency synthesizer circuit depicted in FIG. 3, consistent with embodiments of the present disclosure.

FIG. 4 depicts a signal timing diagram for the frequency synthesizer circuit depicted in FIG. 3, consistent with embodiments of the present disclosure. For duty-cycled PLLs, the first rising edge can have a delay relative to the reference edge that is used for triggering the DCO. At the same time, the oscillator can experience a frequency settling phase due to multiple nonidealities. In order to prevent inaccurate CKVD4 cycles, due to frequency settling of the RF clock, from being counted and compared with the reference clock, various embodiments allow for the exclusion of the first few CKVD4 cycles from being counted by the loop for feedback purposes. Relative to the first rising edge when the frequency of CKVD4 can be considered accurate, information about the position of the first rising edge relative to the reference edge can be used to control the delay of DTC1. Since the single-bit TDC1 is used to make a bang-bang comparison between the phase of the ref signal and the phase of the CKVD4 signal, the inputs to TDC1 (CKVD4S_offset_compensated and ref2) should be aligned, assuming that there is no jitter.

According to some embodiments, CKVD4S_offset_compensated represents a sampled and delayed version of CKVD4. The delay can include gate delays caused by the physical implementation of the sampling function. A signal that is known to be ahead of the CKVD4 signal can be used to sample the CKVD4 signal. This signal can be created with the help of DTC1 since the input of DTC1, ref1, is ahead of its output, ref2, by a same amount at the first and second rising edge of the reference clock. Since ref2 is aligned with CKVD4S_offset_compensated after lock is achieved, ref1 can be used to sample CKVD4 under a few design constraints.

In a fractional mode, (N"+1)*TCKVD4 is larger than Tref by a fractional cycle, where N" is the integer part of FCW" and FCW" is defined as FCW/4. Accordingly, DTC2 can be used to insert the fractional cycle to the bottom reference path at the second edge of the windowed FREF clock. The insertion of the fractional cycle at the second rising edge of the reference clock ensures that ref1 is ahead of CKVD4 by the same amount at its first and second rising edge. This can be useful for prevention of possible metastability issues. In various embodiments, the frequency synthesizer circuit can meet certain timing constraints to ensure that ref1 can safely sample CKVD4. For instance, two programmable delay lines can be inserted to the bottom and top reference path to create variable delays that can be used to set delays indicated by dly1 and dly2.

Consistent with certain embodiments, the controller circuit 308 ("CKV Edge Sampling & DTC Gain Calibration" block)

can sample the RF signal so that the sampling rate of the TDC can be kept low (e.g., at approximately the reference frequency). This can be particularly useful for saving power. The control circuit can include sampling circuitry designed for the two inputs of the TDC being aligned. The sampling circuitry can use a single-bit TDC because different delayed reference clocks can be used for sampling the RF signal and for comparison thereto.

The following equations define timing and interactions for a number of terms shown in the timing diagram of FIG. 4:

Offset=dly(DTC1)+DTCoffset(DTC1)

Fractional cycle=dly(DTC2)

$A$=dly1+DTCoffset(DTC2)

$B=t_{por}+t_{pDFF}$+DTCoffset(DTC3)

DTCoffset(DTC1)=DTC$_{offset}$(DTC2)=DTC$_{offset}$(DTC3)

Consistent with FIG. 4 and other figures, some of the signal names used in the various figures include an indication of an edge transition direction and the number of the edge. For instance, ref1[r](1) refers to the first rising edge of the ref1 signal, and ref1[f](2) refers to the second falling edge of the ref1 signal.

Figure 5:
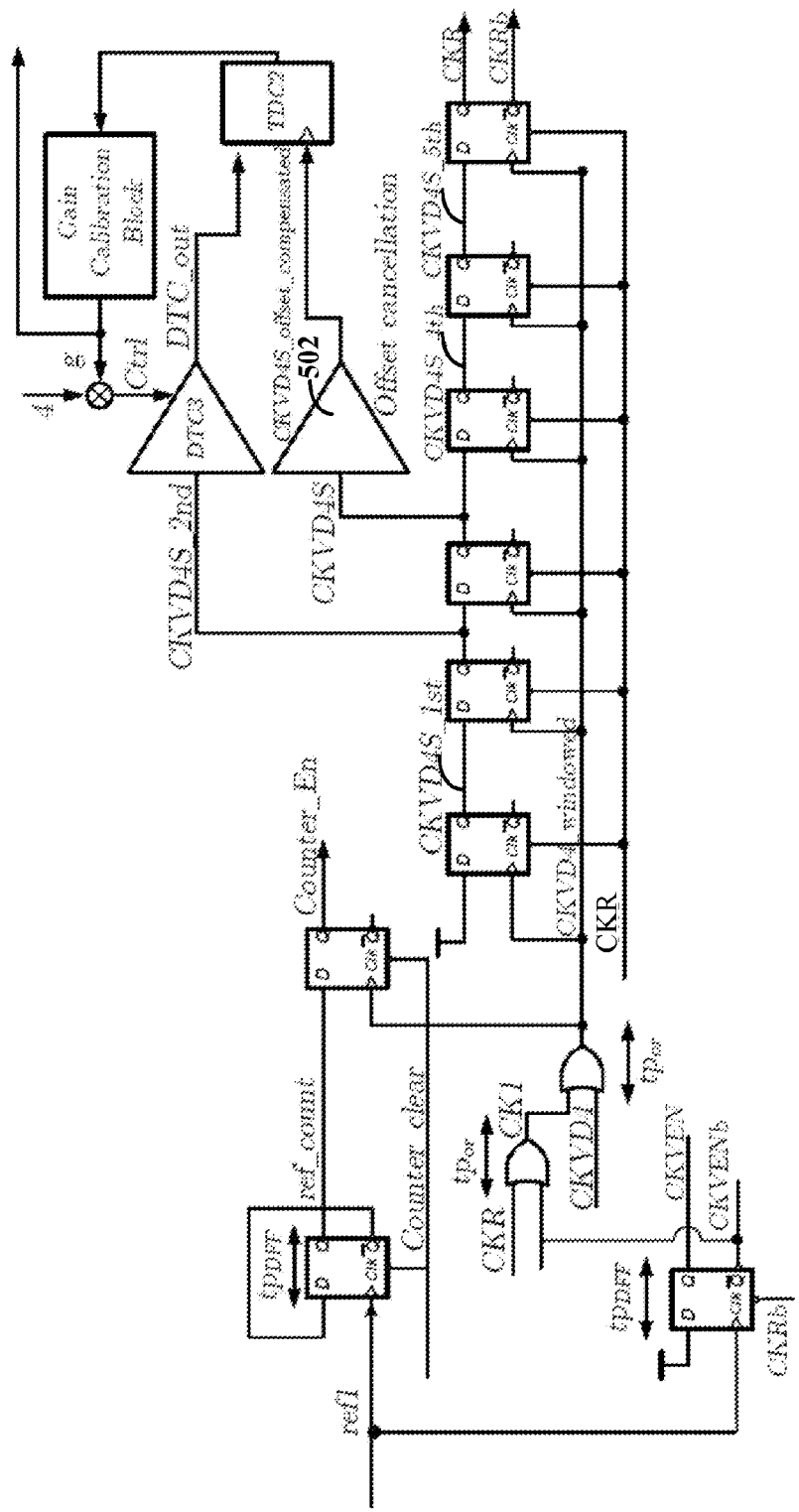
FIG. 5 depicts a circuit diagram for a portion of a controller circuit, consistent with embodiments of the present disclosure.
Figure 6:
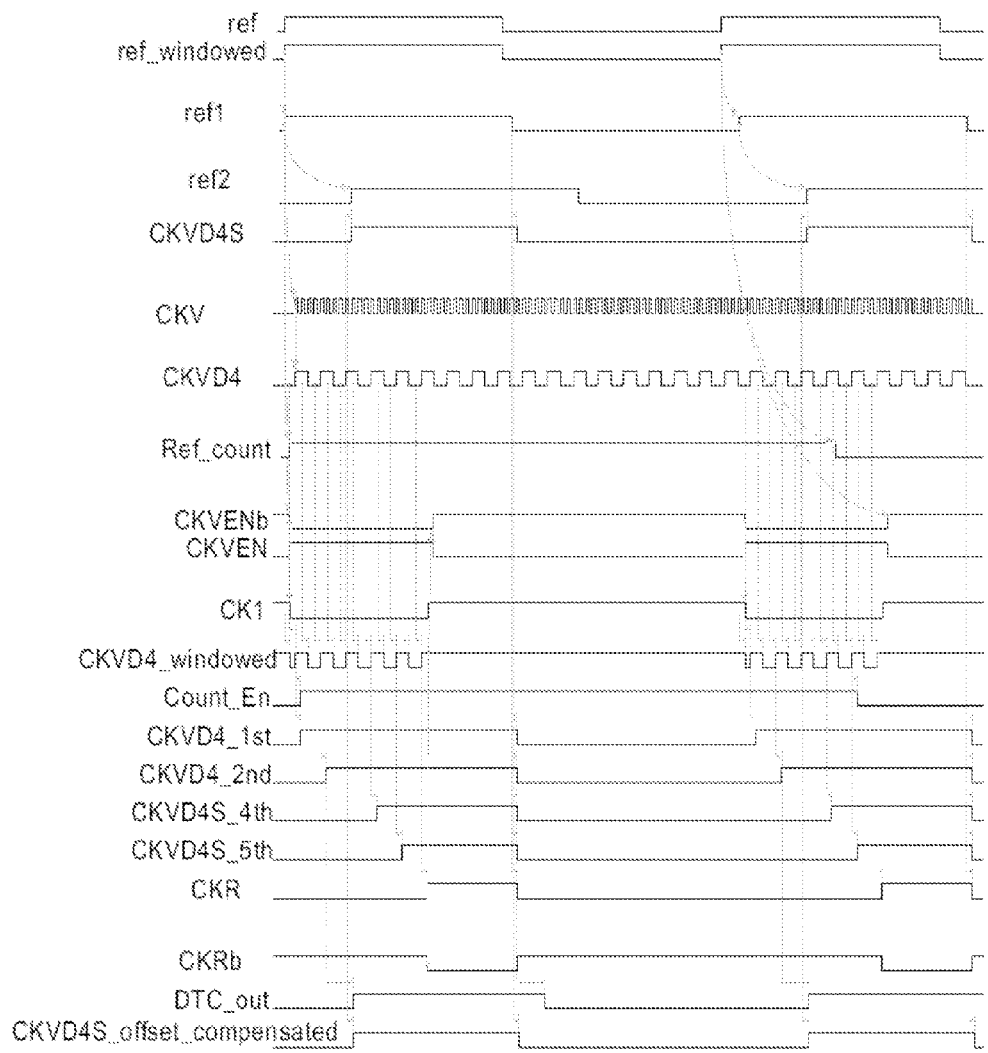
FIG. 6 depicts a signal timing for the circuit diagram of FIG. 5, consistent with embodiments of the present disclosure.

FIG. 5 depicts a circuit diagram for a portion of a controller circuit, consistent with embodiments of the present disclosure. Signal timing for the circuit diagram of FIG. 5 is shown in FIG. 6. For simplicity, FIGS. 6-9 do not include delays caused by various circuit components (e.g., delays of the buffer and divider circuits, as shown in the circuit diagrams, are not included). The Counter_En signal is used to set the counting window of the counter and is triggered by the first CKVD4 rising edge that occurs after the first rising edge of ref1. This timing relationship can be useful for mitigation of metastability issues at the counter. In certain embodiments, the Counter_En signal can be generated by sampling ref count using CKVD4. Timing constraints for such an operation are given as:

$T$(ref1[$r$](1))+$t_{pDFF}$+$t_{hold}$<$t$(CKVD4[1](1))+$t_{Por}$

According to various embodiments, the third CKVD4 rising edge after the first rising edge of ref1 can be sampled and compared with the delayed phase of the reference clock. The particular edge can be chosen based upon the particular operating parameters of the devices. For example, the third edge can be chosen based upon an operation frequency range of 5.0-7.0 GHz. For such a frequency range, 8 cycles of CKV corresponds to 1.6 ns to 1.1 ns, which can be sufficient for the oscillator's frequency to stabilize (e.g., to within 0.1% of the stabilized oscillation frequency). DTC3 can be calibrated against TCKVD4 and the extracted gain can then be used to set the fractional cycle delay for DTC2. According to some embodiments, a delay circuit 502 can be used to provide offset cancellation. This can be useful for compensation of offsets that can be introduced by the use of DTC circuits having a non-zero delay for their lowest delay setting.

The embodiments shown in FIG. 5 are consistent with an oscillator in which the frequency of CKVD4 is considered accurate enough starting from its third rising edge. Thus, the third CKVD4_windowed edge is sampled and compared with the reference phase. The choice of the third edge corresponds to embodiments for which the RF frequency takes about 8 cycles to stabilize (within the specified margin). In other embodiments, the choice of which clock edge to sample can be different. For example, the second rising edge of CKVD4 can be used by sampling earlier in the chain of flip-flops. The rising edge of CKR can also be delayed by increasing the total number of D flip-flops (e.g., to allow more time for the RF signal to settle). A potential drawback of inserting additional stages is that the oscillator will be turned on for a longer duration, resulting in higher energy consumption.

Figure 7:
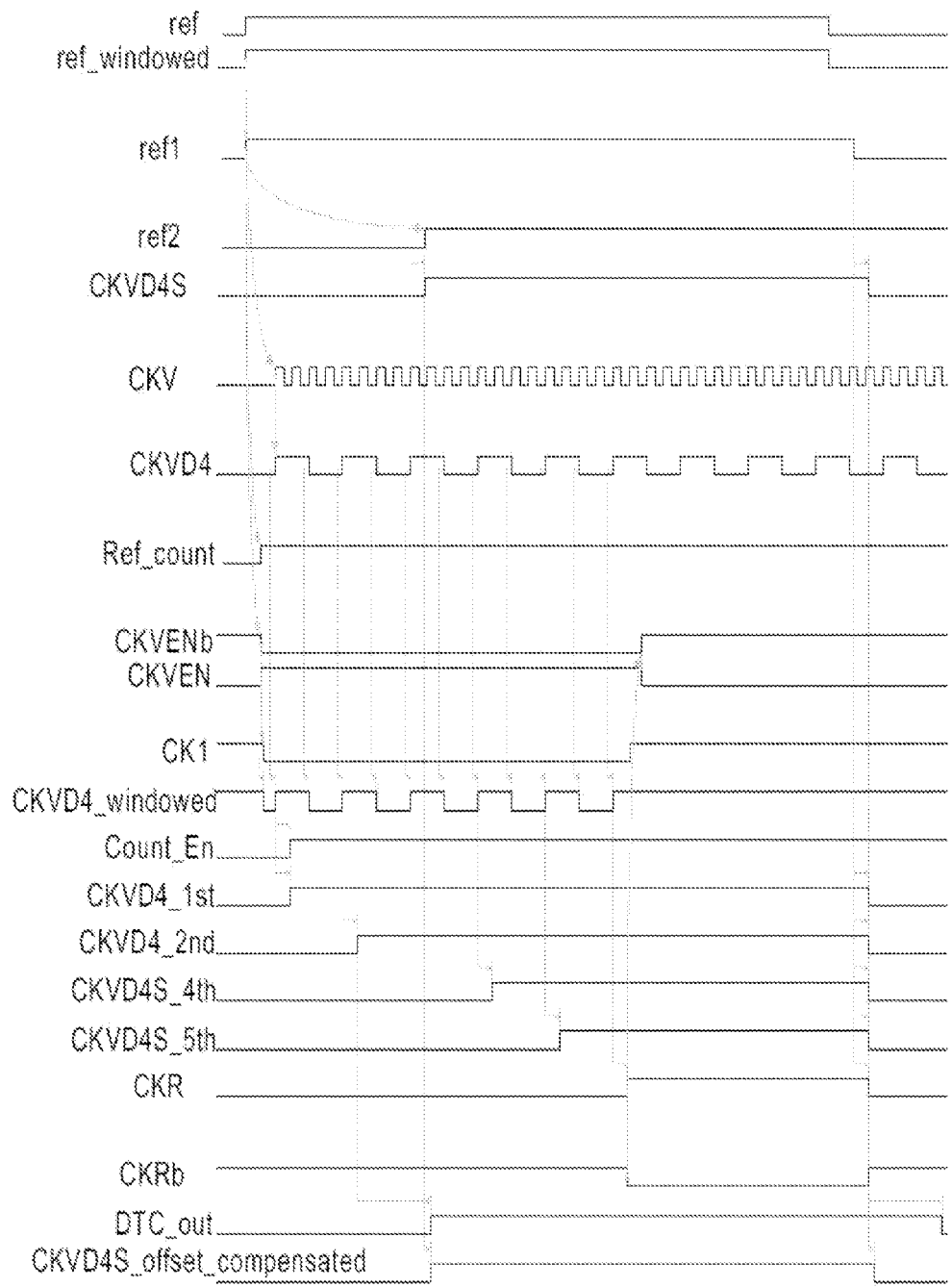
FIG. 7 shows a timing diagram in which the delay settings for both dly1 and DTC_offset are zero, consistent with embodiments of the present disclosure.
Figure 8:
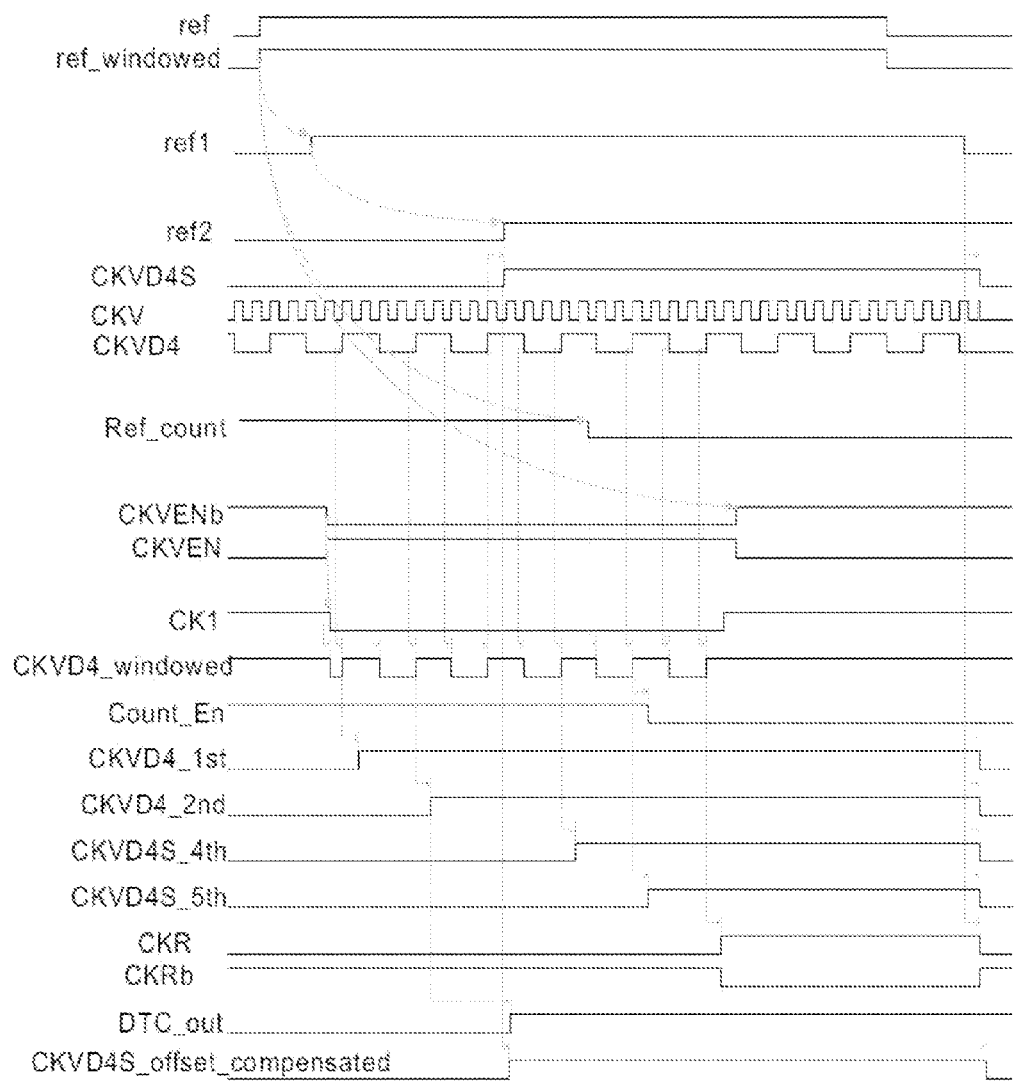
FIG. 8 is a timing diagram with a close look at the timing relative to a first rising edge, consistent with embodiments of the present disclosure.

FIG. 7 shows a timing diagram in which the delay settings for both dly1 and DTC_offset are assumed to be zero for simplicity, consistent with embodiments of the present disclosure. FIG. 8 is a timing diagram similar to FIG. 7, but with a closer look at the timing relative to a first rising edge, consistent with embodiments of the present disclosure. As shown in FIG. 8, CKVD4_windowed does not transition during a significant portion of the timing diagram (e.g., as compared to the number of signal transitions for CKVD4). Thus, the power consumed by the sampling operation of the flip-flops depicted in FIG. 5 is reduced during this time period.

FIG. 7 shows that the rising edges of CK1 are each ahead of the rising edge of CKVD4 by the same amount, which can avoid metastability issues at both edges. In order to properly sample CKVD4[r](1), the following timing constraint can be placed on CK1[f](1): T(CK1[f](1))<t(CKVD4[r](1)).

This timing constraint can be translated to a constraint between ref1 and CKVD4:

$t$(ref1[$r$](1))+$t_{pDFF}$+$t_{Por}$<$t$(CKVD4[4](1))

A variable "Slack" can be defined as:

Slack=$t$(CKVD[$r$](1))−$t$(ref1[$r$](1))−$t_{pDFF}$−$t_{Por}$

Substituting the slack variable with the timing constraint between ref1 and CKVD4, the timing constraint can be specified as: Slack>0.

According to the above constraints, as long as $t_{hold}$<2 $t_{Por}$, Slack>0 is the dominant timing constraint. This assumption is reasonable for many practical cases. While this can specify a bottom boundary for Slack, it does not specify an upper boundary. The upper boundary can be set relative to timing constraints that ensure that CKVD4[r](N"+2) is sampled instead of CKVD4[r](N"+1), at the 2nd rising edge of the windowed reference clock. N" can be defined by N"+α"=FCW/4. The upper boundary for this condition can be specified as: Slack<$T_{CKVD4}$.

As shown in FIG. 5, a number of signals (CKVD4S_$1^{st}$, CKVD4S_$2^{nd}$, etc.), are reset by the CKR signal. The CKR signal, according to the circuit of FIG. 5, is present three CKVD4 clock periods (or "cycles") after the first CKVD4S rising edge. The delay can be set to a desired number of cycles. For example, a delay of three cycles can be set to ensure proper comparison between CKVD4S_offset_compensated and ref2.

Consistent with FIG. 8, the DCO is turned off by the falling edge of CKR, which is designed to be provided later than the rising edge of CKVD4S_offset_compensated. It is recognized that the oscillator can exhibit chaotic behavior when in the process of getting turned off. Accordingly, the timing between the falling edge of CKR and the rising edge of CKVD4S_offset_compensated can be set to be sufficiently large to avoid problems associated with the comparison between CKVD4S_offset_compensated and ref2.

Figure 9:
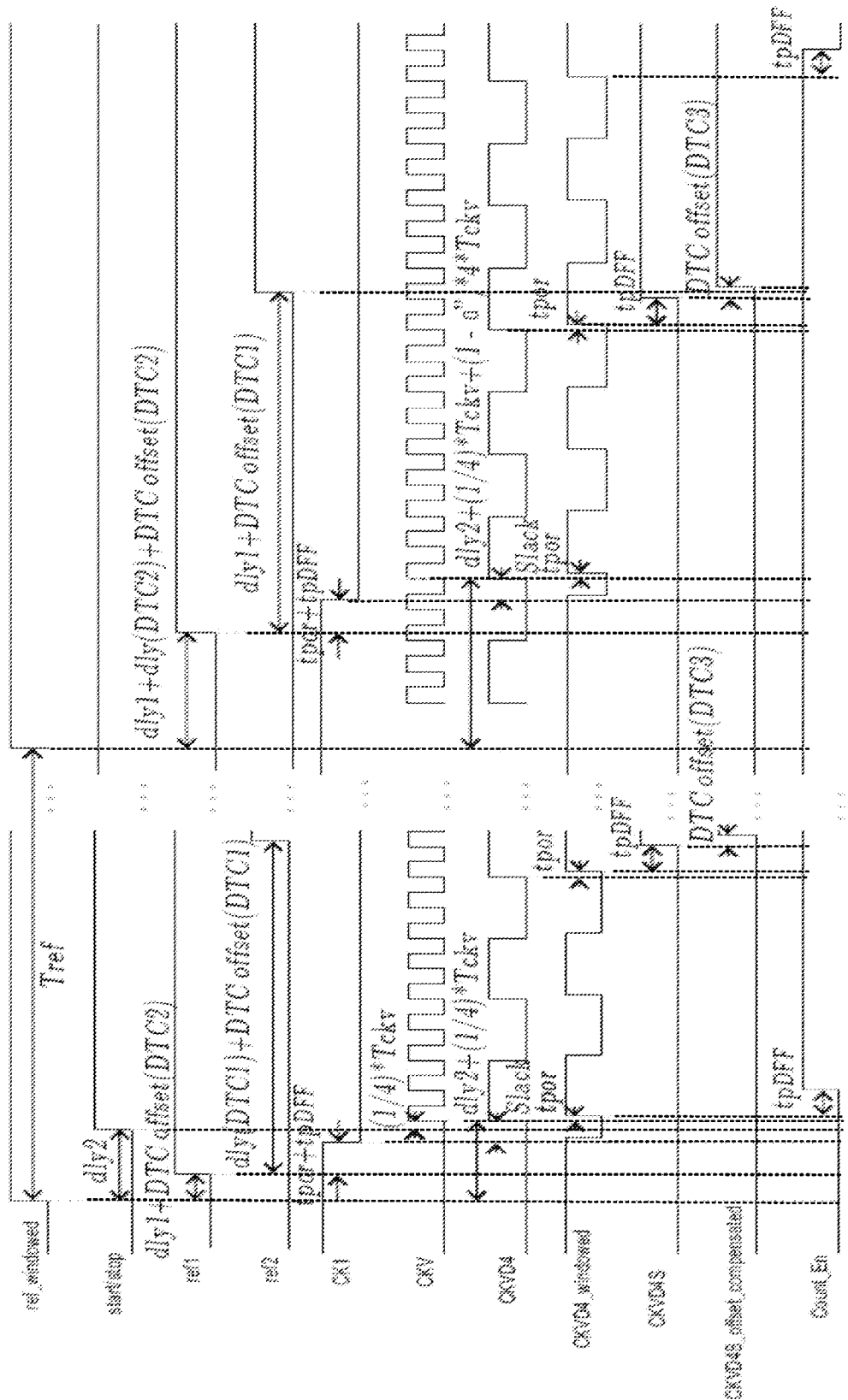
FIG. 9 depicts a diagram showing the relative timing between the signals in a controller circuit at a second transition edge of the reference clock, consistent with embodiments of the present disclosure.
Figure 11:
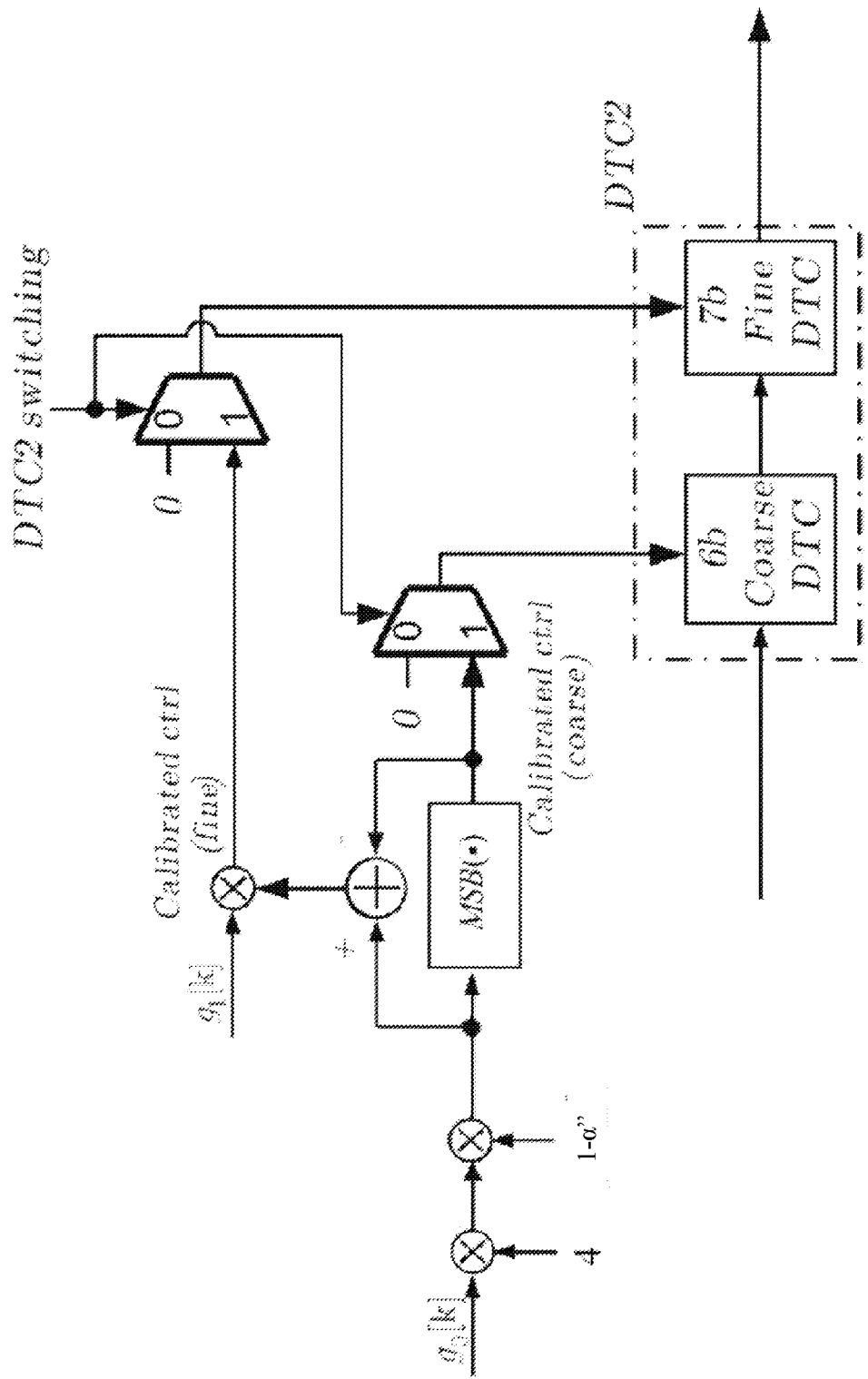
FIG. 11 shows the application of the extracted gain to the DTC2 circuit, consistent with embodiments of the present disclosure.

FIG. 9 depicts a diagram showing the relative timing between the signals in a controller circuit at a second transition edge of the reference clock, consistent with embodiments of the present disclosure. The values for the delays in FIG. 11 are:

$$dly(DTC2) = (1 - \alpha'') \cdot 4 \cdot T_{CKV} \cdot dly(DTC1) =$$

$$dly2 - (dly1 + DTC \text{ offset}) + \frac{1}{4} \cdot T_{CKV} + 8 \cdot T_{CKV} + t_{P_{or}} + t_{P_{DFF}}$$

Assuming that DTC2 gives a correct fractional cycle, the value of Slack is the same at the first and second rising edge of the reference clock and is given by Slack:

$$\text{Slack} = dly2 - dly1 - \frac{1}{4} \cdot T_{CKV} + DTC \text{ offset} - (t_{P_{or}} + p_{DFF})$$

In some instances, the timing constraint for Slack, relative to properly sampling CKVD4, can be set to: 0<Slack<4*$T_{CKV}$. Accordingly, dly1 and dly2 can be adjusted to meet these timing constraints. This adjustment might occur, for example, during the design phase relative to the specific design of interest.

In various embodiments, the delay of DTC1 can be expressed in terms of Slack as follows: dly(DTC1)=Slack+2 ($t_{Por}$+$t_{Pdff}$)+8$T_{CKV}$.

Accordingly, DTC1 can be configured to cancel the initial offset relative to the FREF clock and DTC2 can be configured to introduce a fractional delay cycle that corresponds to the frequency multiplier ratio for the system. Consistent with various embodiments, the DTC circuits can be configured with coarse and fine adjustment settings. For instance, the DTC circuits can be configured with selectable delay unit (buffer circuits) that can be used to provide a coarse delay control and with an adjustable capacitance for fine delay control. As a non-limiting example, DTC1 can be configured with a 7-bit-wide control word that defines the coarse selection settings and an 8-bit-wide control word that defines the fine selection settings, while DTC 2 can be configured with 6-bit-wide and 7-bit-wide control words for coarse and fine selection settings, respectively. As another non-limiting example, the step size of the coarse selections can be 28 ps while the step size of the fine selections can be 0.29 ps. Other configurations are possible.

Figure 10:
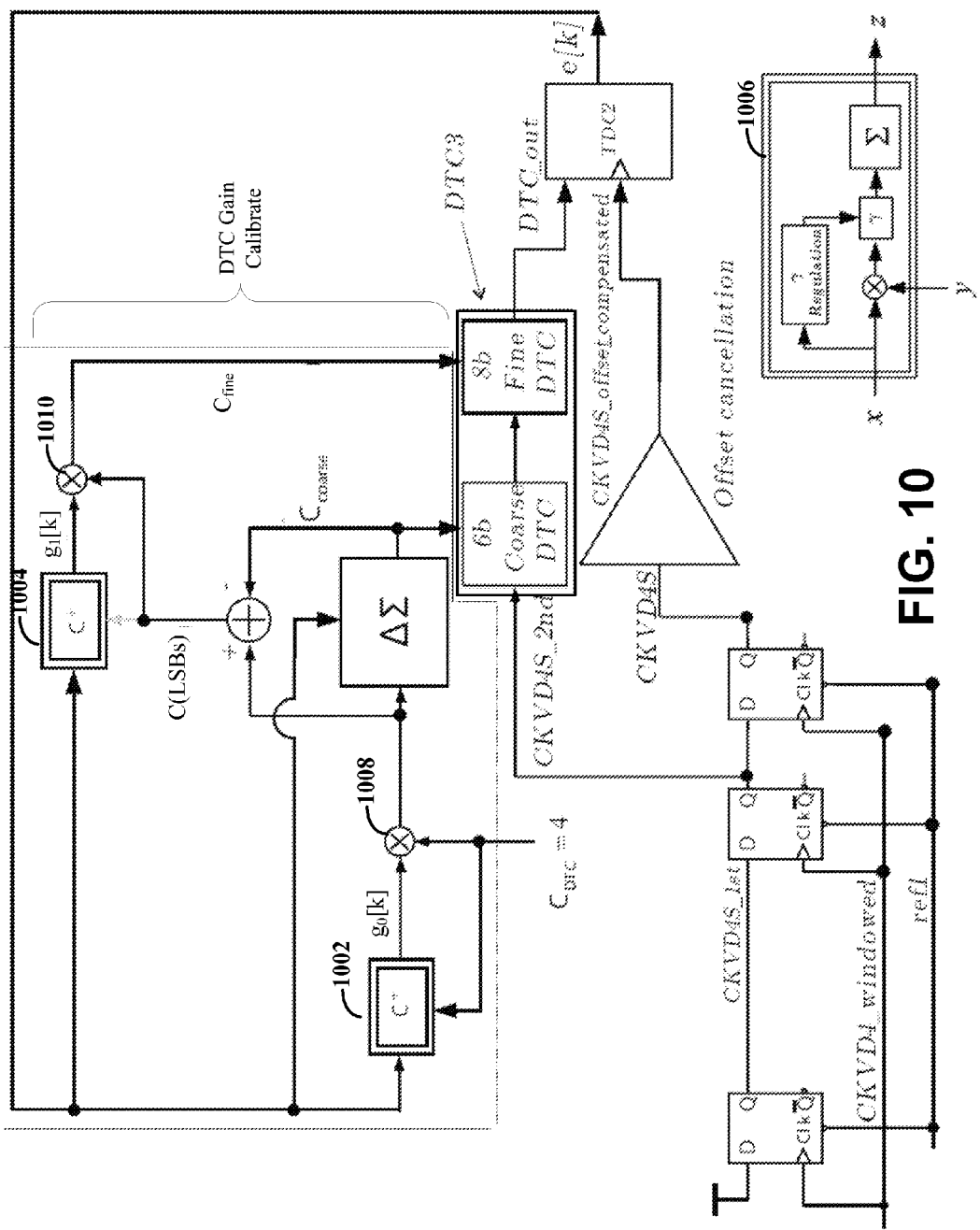
FIG. 10 shows a circuit diagram of a gain calibration circuit for extracting the gain of a DTC, consistent with embodiments of the present disclosure

FIG. 10 shows a circuit diagram of a gain calibration circuit for extracting the gain of a DTC, consistent with embodiments. In addition to DTC1 and DTC2, various embodiments use another DTC (DTC3) to extract the gain settings for the DTC circuits. This gain can then be used to provide the correct gain setting for the fractional cycle of DTC2. In certain embodiments, the DTC circuits can use a coarse-fine structure with two different gain settings. For instance, feedback e[k] from the TDC2 (a single-bit phase detector circuit) can be provided to correlator blocks 1002 and 1004 to produce two different gains that are used to set the coarse and fine delay settings, respectively. Consistent with embodiments of the present disclosure, correlator circuit blocks 1002 and 1004 can be implemented as shown by circuit diagram 1006.

FIG. 10 allows for the correct setting for the delay of DTC2 by extracting the gain of both the coarse and the fine stage of the DTC circuits. The total delay from both coarse-fine settings of the DTC can be expressed as:

delay[k]=($C_{DTC}\cdot g_0[k]$){MSBs}·$\Delta t_{course}$+($C_{DTC}\cdot g_0[k]$){LSBs}·$g_1[k]$·$\Delta t_{fine}$ where $\bar{g}_0$ and $\bar{g}_1$ are the nominal gain for the coarse bank and the fine bank, respectively, and are expressed in:

$$\bar{g}_0 = \frac{T_{CKV}}{\Delta t_{coarse}}.$$

and $$\bar{g}_1 = \frac{\Delta t_{coarse}}{\Delta t_{fine}}$$

$\Delta t_{coarse}$ and $\Delta t_{fine}$ are the LSB step sizes for the coarse and fine bank.

The gain calibration circuitry shown in FIG. 10 is configured to lock the delay of DTC3 to a single TCKVD4 cycle with the help of a feedback loop. At the same time, $2^{r-1}$, (e.g., with r=8 in the depicted example), is occasionally subtracted/added to the uncalibrated control word, C(LSBs), of the fine DTC, while 1 is added to/subtracted from the calibrated control word, $C_{coarse}$ of the coarse DTC. In this way, the average value of $g_1[k]$ will follow the same value as:

$$\bar{g}_1 = \frac{\Delta t_{coarse}}{\Delta t_{fine}}.$$

The particular settings for the size of the DTC control word and step sizes can be set according to the design and application. For example, a 7-bit fine bank can be configured with a delay range that is larger than a single step delay of the coarse bank. The particular margin between the delay ranges can be sufficient to allow for process variation. For such an example, the following relation can be specified as:

$$\frac{\Delta t_{coarse}}{\Delta t_{fine}} \geq 2^{r-1}, r = 8$$

Because $2^{r-1}$ is subtracted from the uncalibrated control word, C(LSBs), of the fine bank of DTC3, DTC3 can have a fine bank with an additional bit relative to DTC2.

Consistent with embodiments, multiplication circuit 1008 for $g_0[k]$ can be implemented by a circuit that bit-shifts during the coding stage. Thus, the correlator at the fine path does not need a full multiplier circuit. In various embodiments, the step size of the correlators, γ, can be regulated in an adaptive manner, which can help to lock the gain faster than a fixed-step one. The multiplication circuit 1010 for $g_1[k]$ can be implemented as a hardware based 8-bit multiplier.

FIG. 11 shows the application of the extracted gain to the DTC2 circuit, consistent with embodiments. As discussed herein, the delay of DTC3 can be calibrated to a single cycle of TCKVD4. This leads to the $g_0[k]$ following the nominal value expressed above. The extracted gain $g_0[k]$ and $g_1[k]$ can be applied to DTC2, together with the fractional control word 1−α", to create a DTC2 delay that equals the desired fractional delay.

Since the locking of the PLL relies on an accurate DTC2 delay while an accurate DTC2 delay relies on an accurate estimation of DTC gain, the extracted gain from DTC3 can be passed to DTC2 without being filtered before locking. This can allow for the DTC2 delay to be quickly set close to the accurate value while being filtered after locking to ensure that random noise is suppressed during the estimation of the DTC gain.

The multiplication of $g_0[k]$, 4 and 1−α" in FIG. 11 can be implemented using a 16-bit multiplier while the multiplication of $g_1[k]$ can use an 8-bit multiplier. Consistent with embodiments, the hardware cost of the 16-bit multiplier can be reduced by spreading the calculation over multiples clock cycles, during which there is no pulse. By using a radix-4 Booth-coded sequential multiplier, which spreads the 16-bit multiplication over 8 clock cycles, a good trade-off can be achieved between hardware and temporal cost.

Figure 12:
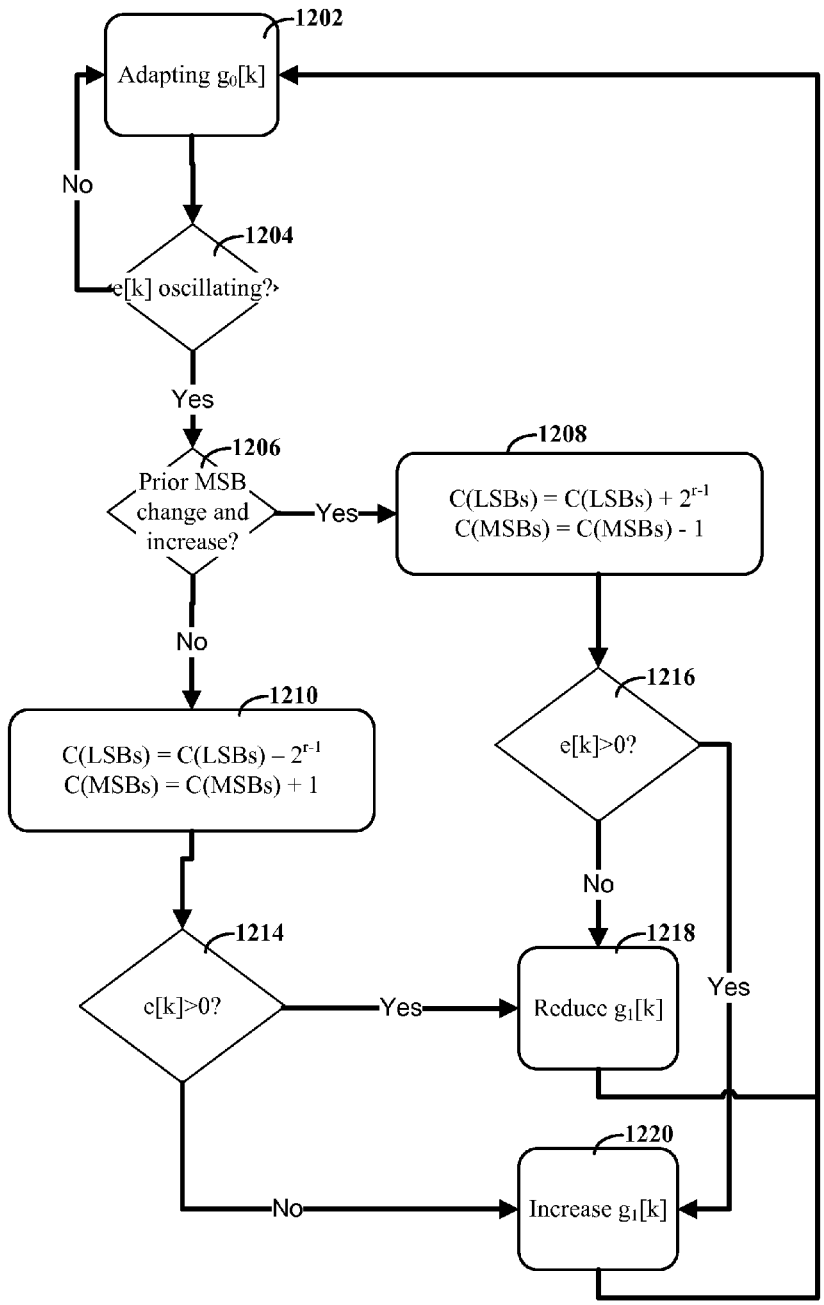
FIG. 12 shows a flow diagram for a DTC gain calibration algorithm, consistent with embodiments of the present disclosure.

FIG. 12 shows a flow diagram for a DTC gain calibration algorithm, consistent with embodiments. The algorithm can be carried out by one or more circuits, consistent with the various figures and discussion herein. The algorithm can begin by adapting the coarse DTC gain, $g_0[k]$, based on a feedback loop, as shown by block 1202 and consistent with the descriptions herein. While the coarse DTC gain is being adapted, the output of the TDC, $e[k]$, can be monitored in order to determine whether or not the output is oscillating between positive and negative feedback values (e.g., transactions between +1 and −1), per block 1204. In particular embodiments, this can be three successive transitions +1, −1, +1 or −1, +1, −1. If $e[k]$ is not oscillating, then the algorithm returns to block 1202 and the coarse DTC gain continues to be adjusted. If $e[k]$ is oscillating, then the most significant bits of the uncalibrated control word (CMSB) can be adjusted up or down. Block 1206 shows that a decision on the direction of the adjustment can be based upon the prior adjustment direction. Thus, if the prior adjustment was an increase to the CMSB, then the CMSB can be decreased by one, as shown by block 1208. At the same time, the least significant bits of the uncalibrated control word CLSB can be adjusted up by $2^{r-1}$, where r is the number of LSBs. If the prior adjustment was a decrease to the CMSB, then the CMSB can be increased by one, as shown by block 1210. At the same time, the least significant bits of the uncalibrated control word CLSB can be adjusted down by $2^{r-1}$.

Blocks 1214 and 1216 depict a determination as to whether the DTC delay was ahead or behind CKVD4S_offset_compensated (as indicated by the value of $e[k]$ relative to 0) after the change from the corresponding blocks 1210 and 1208, respectively. This determination can be used to determine whether to increase or decrease the fine gain, $g_1[k]$, per blocks 1220 and 1218, respectively. The algorithm can then return to block 1202.

Various embodiments are directed toward amplitude calibration and control for the oscillator circuit, which can be an LC-DCO configured for use in duty-cycled modes. For instance, the LC-DCO can include inverter circuits that are configured to generate an output signal that oscillates when there is energy in the tank circuit. To support the duty-cycled mode, the LC-DCO can include a switch circuit that is configured to operate in a first (stopped) mode in which the capacitive element of the oscillator circuit is held at a pre-charged voltage that corresponds to a supply voltage and in a second mode (running) in which the tank circuit oscillates.

Consistent with embodiments, the output amplitude of the oscillator circuit can vary according to the frequency of oscillation. As discussed herein, a plurality of auxiliary circuits (or "cores") can be used to adjust the effective transconductance gain of the inverter circuits and thereby control the amplitude of the output signal. In order to properly set the transconductance gain and amplitude, a calibration circuit can be configured to detect an amplitude of the output signal, and adjust, in response to the detected amplitude, a number of the plurality of auxiliary circuits that are enabled. This can be particularly useful for compensating for differences between the voltage that the oscillator capacitor is pre-charged to, and the amplitude of oscillation seen on the oscillator while it is running and stabilized from any initial condition. Accordingly, an additional amplitude calibration phase can be used to ensure that the LC-DCO makes voltage swings that are consistent with the pre-charged voltage, which can facilitate near instantaneous startup behavior for the LC-DCO. The transconductance seen by the LC tank can be tuned by turning on/off units in a (e.g., 4-bit) bank of auxiliary active cores. At higher frequencies, fewer active cores are enabled. In this way, the oscillation amplitude for the oscillator can be kept approximately constant within the operation region (e.g., from 5.0-7.0 GHz).

Figure 13:
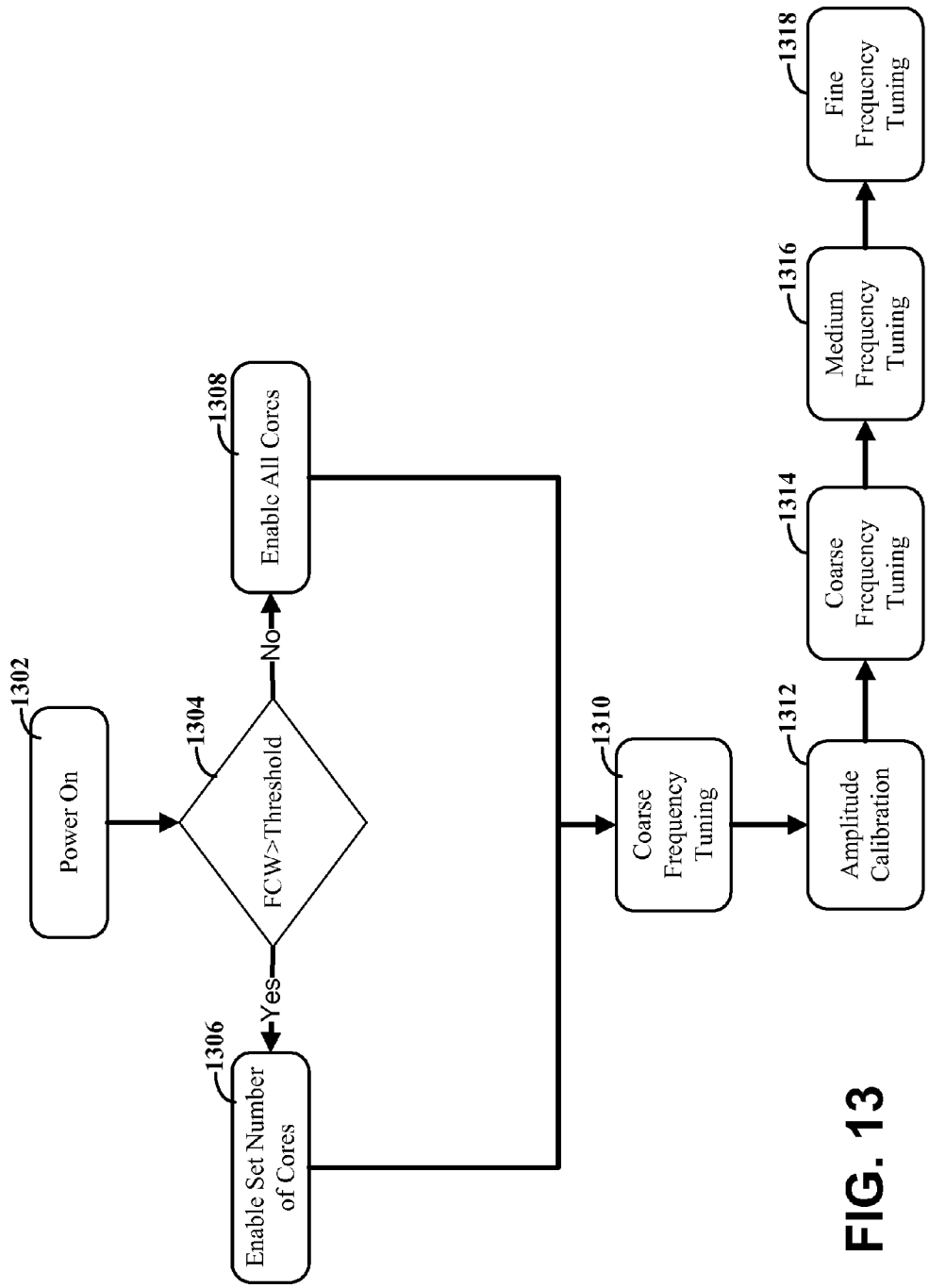
FIG. 13 shows a flow diagram for a calibration algorithm that includes calibrating a voltage amplitude of an oscillator circuit, consistent with embodiments of the present disclosure.

FIG. 13 shows a flow diagram for a calibration algorithm that includes calibrating a voltage amplitude of an oscillator circuit, consistent with embodiments of the present disclosure. When the system or device containing the frequency synthesizer circuit first powers on, per block 1302, a control circuit can determine whether the frequency control word (FCW) is above a threshold, per block 1304. For example, the threshold could be set at the mid-point of the possible FCW values, as would be relative to the frequency range for the frequency synthesizer circuit. If the FCW is below the threshold, then it is likely that more active/enabled cores will be required to meet the desired amplitude and all (or most) of the cores can be enabled as shown by block 1308. If the FCW is above the threshold, then it is likely that fewer active cores will be required and a set, lower, number of cores can be enabled per block 1306. As a particular example, the default control word is set to the highest value at startup to enable all cores (e.g., a 4-bit bank of auxiliary cores would be set to 15). After the digital circuitry has accessed the FCW, the number of active cores that need to be turned on is estimated based on whether the FCW specifies the PLL to operate in the lower band (LB) or higher band (HB), which corresponds to the thresholds discussed in connection with FIG. 13. If the oscillator operates in LB, then all auxiliary cores are enabled. Otherwise, only half of the auxiliary cores are enabled. In either case, more cores than necessary are enabled during this stage to ensure that the oscillator can oscillate.

Figure 15:
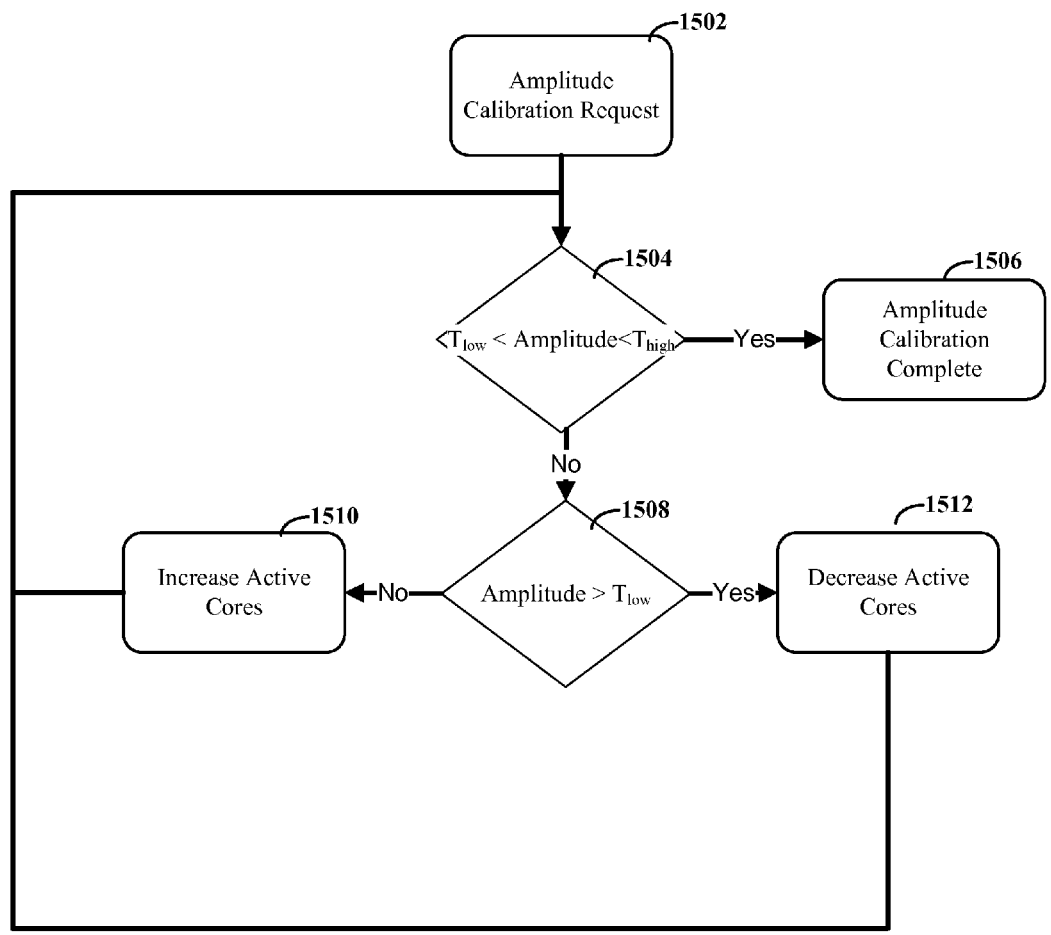
FIG. 15 depicts a flow diagram of an algorithm for performing amplitude calibration, consistent with embodiments of the present disclosure.

The system can be configured to first perform coarse frequency tuning per block 1310. This coarse frequency tuning allows for the frequency of the oscillator to be closer to the nominal value so that a better estimation of the required number of auxiliary cores can be made based on amplitude detection. After meeting certain conditions, the system can begin calibrating the amplitude of the oscillator circuit. An example algorithm for this calibration is shown by FIG. 15. After the amplitude calibration is completed, the resulting change in the parasitic capacitance contributed by the loaded active cores might vary and change the frequency of the PLL. In order to bring the frequency of the PLL to within 1 LSB of the coarse capacitor bank before starting locking with the medium bank, a 2nd-round coarse frequency locking can be performed, per block 1314. As the change in frequency is expected to be much smaller than during the prior coarse frequency locking, amplitude calibration might not be required after this; however, various embodiments include an additional amplitude calibration that is performed at this time. Medium 1316 and fine 1318 frequency tuning can be implemented after the additional amplitude calibration.

Figure 14:
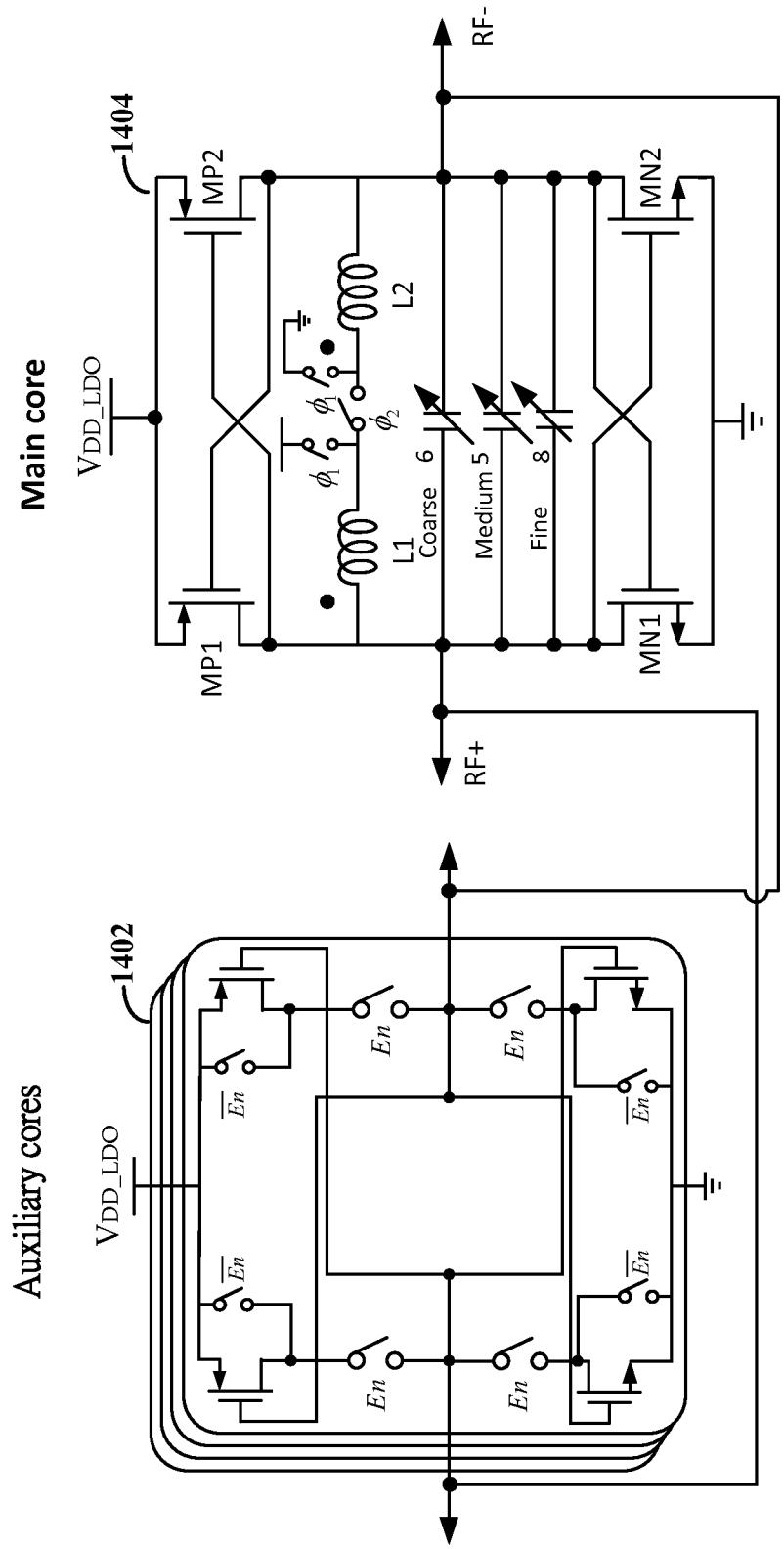
FIG. 14 depicts a circuit diagram with auxiliary cores, consistent with embodiments of the present disclosure.

FIG. 14 depicts a circuit diagram with auxiliary cores, consistent with embodiments of the present disclosure. Main core 1404 can be configured to function as an LC oscillator circuit, consistent with various embodiments discussed herein. In certain embodiments, the frequency of the LC oscillator circuit can be digitally adjusted by changing the capacitance of the circuit. The depicted circuit shows a capacitor circuit with coarse, medium, and fine calibration settings having six, five, and eight bits of granularity, respectively. Inverters formed by transistors MN1, MN2, MP1, and MP2 can be included to drive the oscillation. Signals $\phi_1$ and $\phi_2$ can be used to control the pre-charging of the LC oscillator and the subsequent enabling of oscillation by closing the connection between inductive elements L1 and L2. Consistent with certain embodiments, this allows for near instantaneous startup of the LC oscillator at a known phase relationship to the $\phi_1$ and $\phi_2$ control signals.

Various embodiments are based upon the recognition that the RF+/−signal amplitude at steady state may not correspond to the pre-charged voltage for the capacitive circuit. For instance, assuming that the pre-charged voltage remains fixed, changes to the oscillation frequency will result in the differences between the pre-charged voltage and the amplitude of oscillation at the different frequencies. This can result in a difference between the amplitude at startup and the steady-state amplitude of the RF signal. Accordingly, a plurality of auxiliary core circuits 1402 can be provided to compensate for this mismatch by increasing the current through the inductor. For example, enabling more cores has the effect of increasing the effective transistor widths of the main core, therefore increasing the reinforcement of the current during oscillation. This has a similar effect as increasing the biasing current for designs that include a biasing transistor. Thus, more auxiliary cores can be enabled to compensate for a reduction in oscillator amplitude due to a change in frequency.

In the context of FIG. 14, the enable signal (En) is used to denote a control signal that can selectively enable a particular auxiliary core circuit from the plurality of auxiliary core circuits. Consistent with embodiments, there can be a set of different individual En signals, where each En signal corresponds to a different auxiliary core circuit. The auxiliary core circuits can be configured to adjust, when enabled, the transconductance provided to the LC tank so that the steady-state RF signal amplitude matches the pre-charged voltage for the capacitive circuit. Moreover, it is recognized that the real part of the impedance for LC oscillator can vary according to the frequency of the RF signal. In some implementations, the auxiliary core circuits may be configured, for example, to adjust the effective transconductance to maintain a constant amplitude over a wide range of different frequencies. As shown in FIG. 14, each auxiliary core circuit 1402 can include a set of transistors that are configured to contribute and adjust the transconductance provided to the LC oscillator circuit when the corresponding auxiliary circuit is enabled. When an auxiliary core circuit is disabled, the same set of transistors can be bypassed as noted by the switches controlled by the En signal.

FIG. 15 depicts a flow diagram of an algorithm for performing amplitude calibration, consistent with embodiments of the present disclosure. The amplitude calibration can be carried out in response to a request from the control logic that is configured to control the timing of the calibration modes for the frequency synthesizer circuit, as may be consistent with the calibration algorithm discussed in connection with FIG. 13. Upon receipt of an amplitude calibration request, per block 1502, the system can determine, per block 1504, whether the amplitude of the oscillator circuit output is within a threshold range defined by $T_{low}$ and $T_{high}$. In certain embodiments, the amplitude can be measured using a peak detector circuit.

If the oscillation amplitude is within the threshold range, then the output of the oscillator is within a desired range of voltages and the amplitude calibration can be considered complete, per block 1506. In particular, the threshold values can be set relative to the pre-charged voltage of the oscillator capacitor so as to closely match the initial amplitude of oscillation, which starts at the pre-charged voltage, with the amplitude of oscillation at steady state. In example embodiments, the supply voltage (setting the pre-charged voltage) is 0.8 V, therefore the lower threshold of the amplitude is set to 395 mV while the higher threshold is set to 405 mV (representing single-ended peak-to-peak amplitudes of 790 mV and 810 mV, respectively).

If the oscillation amplitude is not within the desired threshold range, the system can determine whether or not the oscillation amplitude is too low or too high, per block 1508. If the amplitude is too high (Amplitude>$T_{low}$), then additional cores are deactivated to reduce the oscillation amplitude, per block 1510. Otherwise, the amplitude is too low and the number of active cores can be increased, per block 1512. In certain embodiments, the step sizes for the increases and decreases identified in blocks 1510 and 1512 can be a single core. In some embodiments, the step sizes can be variable. For instance, the step size can begin at a larger number and be reduced as the process advances or adjusted based upon the relative difference between the oscillation amplitude and the respective thresholds.

The process can be iterated until the oscillation amplitude is within the desired threshold range, at which time the amplitude calibration can be considered complete, per block 1506. Frequency tuning/locking can then be commenced or continued (e.g., as discussed in connection with FIG. 13).

FIG. 16 depicts an amplitude detection circuit for performing amplitude calibration, consistent with embodiments of the present disclosure. The detection of the oscillation amplitude can be carried out using a peak detector circuit 1606 and a comparator circuit 1608. The inputs of the peak detector circuit 1606 can be connected to the differential RF outputs (RF+ and RF−) while the outputs of the peak detector are two voltages indicating the amplitude of the RF signal relative to respective thresholds. According to embodiments, the peak detect circuit 1606 can be configured to generate two output signals, Vo1 and Vo2, that are both referenced to the same output signal Vo3. Vo1 and Vo2, relative to Vo3, represent the detections for the high and low thresholds, respectively. Comparator circuit 1608 can be configured to perform two comparisons. The first (upper) comparison determines whether the oscillation amplitude is above the high threshold. The second (lower) comparison determines whether the oscillation amplitude is below the low threshold. Thus, if the oscillation amplitude is above the upper threshold, the comparator circuit will produce a one (high) output that can be stored in register 1610. If the oscillation amplitude is below the lower threshold, then the comparator circuit will output a zero (low) output. Accordingly, Table 1 shows the output of the comparator circuit relative to the valid voltage ranges.

TABLE 1

| Osc. Amplitude | Amp < T(low) | T(low) < Amp < T(high) | T(high) < Amp |
|---|---|---|---|
| Compare(low) | 0 | 1 | 1 |
| Compare(high) | 0 | 0 | 1 |

Consistent with embodiments, the threshold range for the amplitude of the oscillator can be set based upon the supply voltage (or upon the pre-charged voltage if different than the supply voltage). For instance, for a supply voltage of 800 mV, a lower threshold can be set at 395 mV and a higher threshold can be set at 405 mV if a single-ended peak amplitude is used. If a differential peak amplitude is used, the thresholds can be set based upon a voltage corresponding to the full supply voltage. For a differential peak-to-peak amplitude, the thresholds can be set based upon a voltage corresponding to double the supply voltage. The particular voltage range set by the thresholds can be increased or decreased depending upon the desired accuracy relative to the supply voltage.

According to embodiments, finite state machines (FSMs) for outer 1602 and inner 1604 loops of the frequency synthesizer circuit can be used to control the timing of the amplitude detection circuit, including the enablement of the peak detector circuit 1606 and the clocking for the capturing of the output signals by registers 1610 and 1612.

Figure 17:
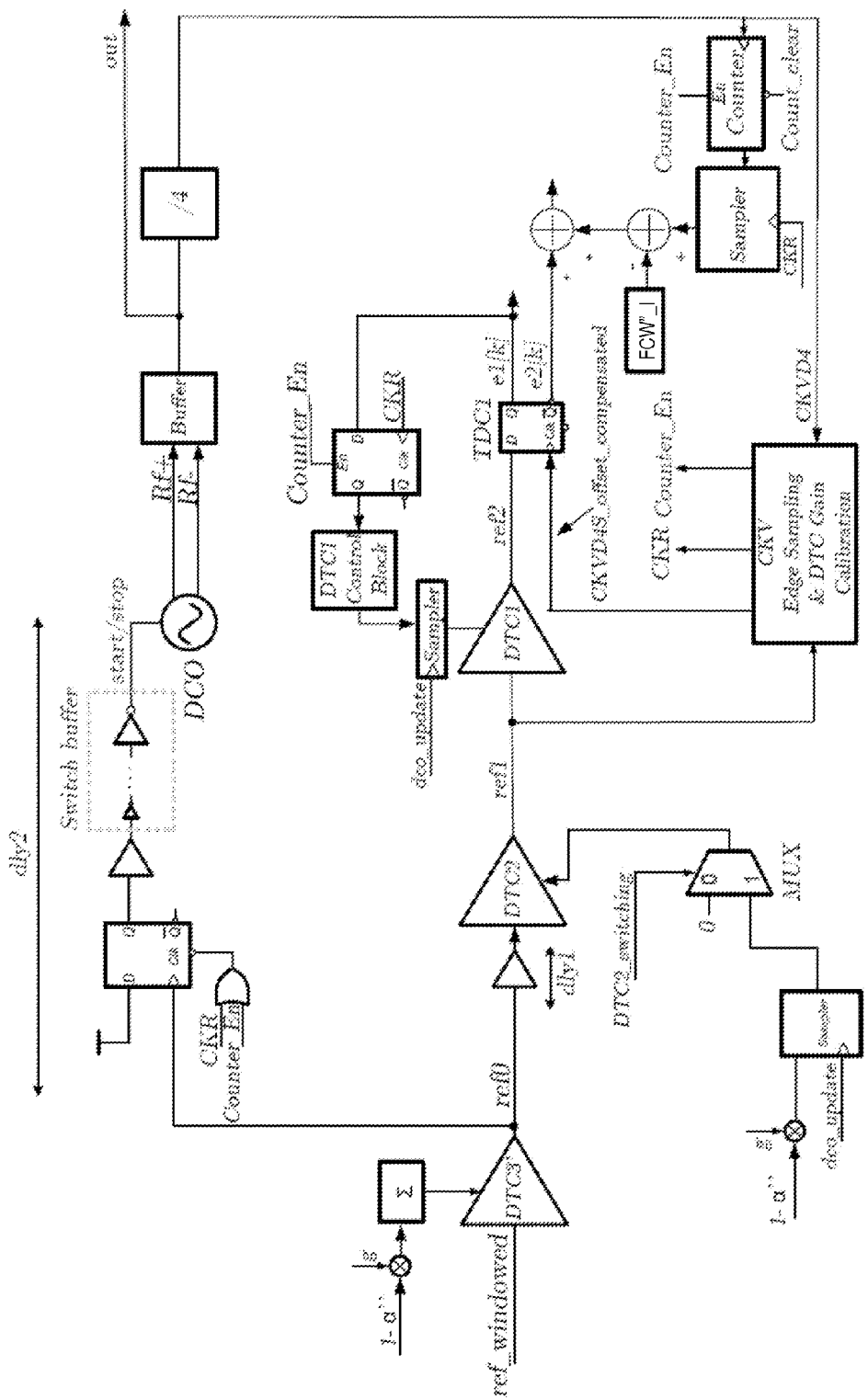
FIG. 17 shows a frequency synthesizer circuit with an additional DTC, consistent with embodiments of the present disclosure.

FIG. 17 shows a frequency synthesizer circuit with an additional DTC, consistent with embodiments of the present disclosure. In some embodiments, the phase difference between the startup phase of CKV and that of the reference clock can be made constant at each burst after locking. The DC-ADPLL can be designed in such a way that the phase difference between the startup phase of CKV and the reference clock maintains its nominal value at the end of the previous burst.

FIG. 17 shows an additional DTC, DTC3', whose delay is an accumulation of the fractional cycle. DTC3' is inserted before each of the paths. Consistent with FIG. 17, another DTC, DTC3' is inserted, while the auxiliary DTC3 in the 'CKV Edge Sampling & DTC Gain Calibration' block is not necessary and there is no longer a need to calibrate a DTC against one cycle of CKVD4. The gain of DTC2 can be estimated with DTC3', and the gain of DTC3' can be self-calibrated.

Figure 18:
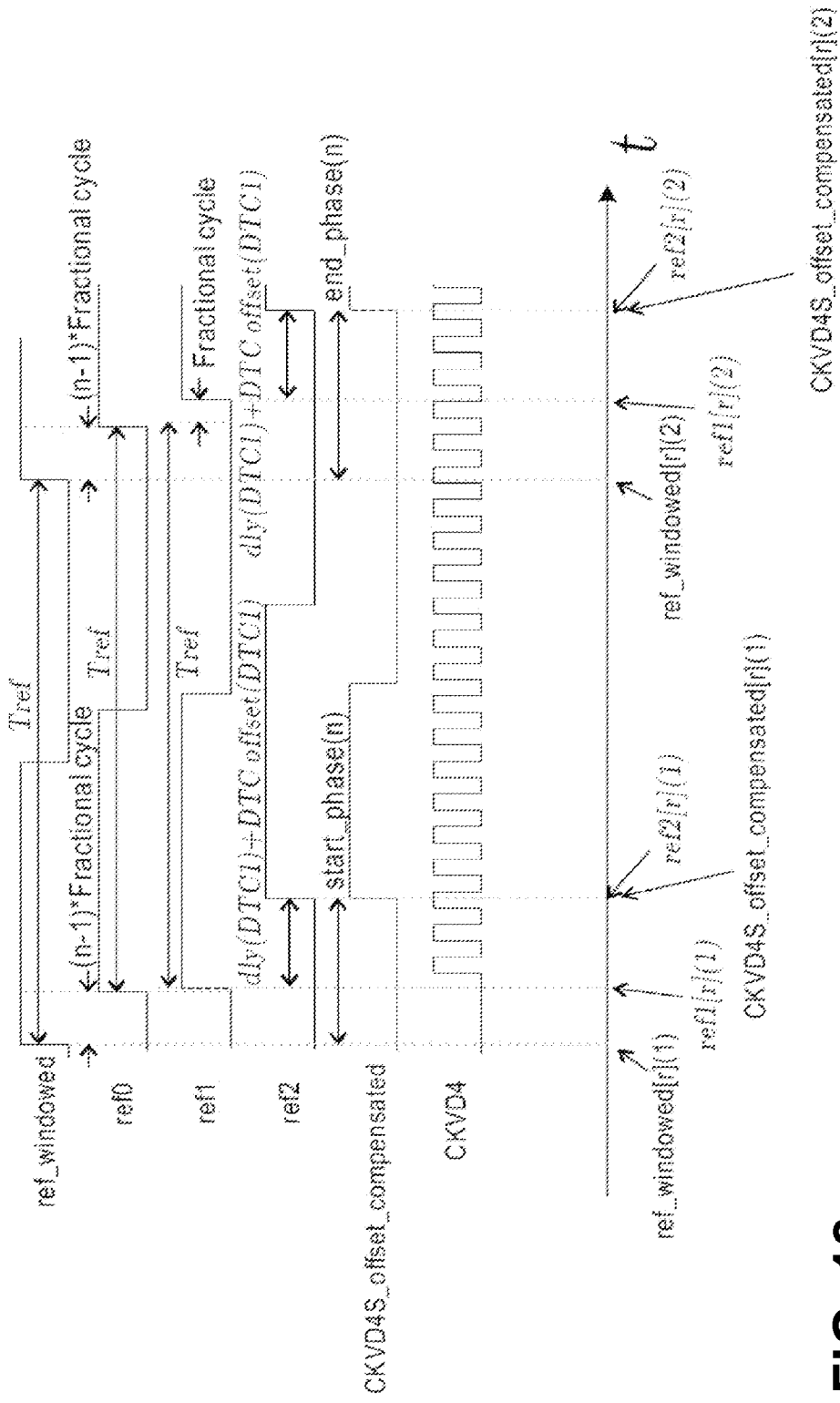
FIG. 18 depicts a timing diagram for a burst for the circuit of FIG. 17, consistent with embodiments of the present disclosure.
Figure 19:
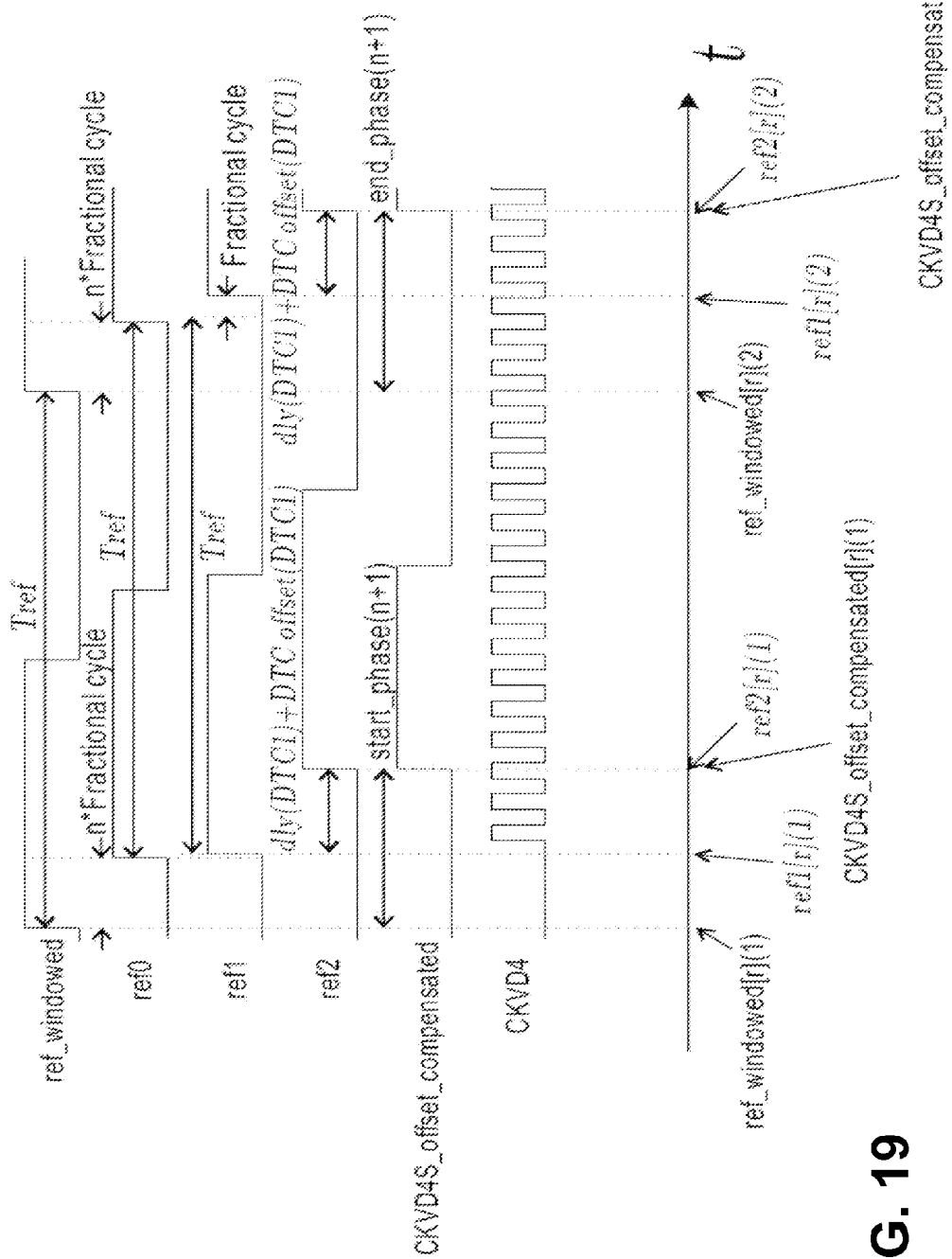
FIG. 19 depicts a timing diagram for a successive burst relative to FIG. 18, consistent with embodiments of the present disclosure.

FIGS. 18 and 19 show timing diagrams for two successive bursts for the circuit of FIG. 17, consistent with embodiments of the present disclosure. The relations between start_phase and end_phase are specified as: end_phase(n)−start_phase(n)=Fractional cycle; and start_phase(n+1)=end_phase(n). The end_phase during the previous burst does not actually need to be measured. The nominal value of start_phase (n+1) is made to be equal to end_phase(n).

The delay of DTC3' is an accumulation of the fractional cycle and once ref0 is ahead of ref_windowed by a full RF cycle, the control word to DTC3' can be reset to reset the accumulation. Accordingly, the timing diagram belonging to burst n and burst (n+1) are chosen to demonstrate an example of operation without loss of generality. Furthermore, since the control word of DTC3' increases from 0 to 1 and is cleared after that, the DTC gain can be locally calibrated and further used by DTC2. Therefore, the DTC3 from FIG. 3A can be eliminated and the total number of used DTCs is still three.

The present disclosure describes a number of different embodiments, features, and aspects. Absent an indication to the contrary, the different embodiments, features, and aspects are not mutually exclusive and can be combined in a variety of different manners.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, an apparatus can include different circuit designs for carrying out similar functions and different configurations than illustrated by the various figures. Such modifications do not depart from the true spirit and scope of various aspects of the invention, including aspects set forth in the claims.

What is claimed is:

1. A frequency synthesizer device with amplitude control, the device comprising:
    an oscillator circuit having:
    an inductive-capacitive (LC) tank circuit having:
    a capacitive element, and
    an inductive element that is connected to the capacitive element;
    driver circuits that are configured to reinforce oscillation to generate output signal that oscillates in response to voltage applied to the tank circuit and a transconductance gain provided to the oscillator circuit;
    a switch circuit that is configured to operate in a first mode in which the capacitive element of the oscillator circuit is held at a charge voltage that corresponds to a supply voltage and in a second mode in which the tank circuit oscillates, wherein the switch circuit includes a switch that prevents current from flowing through the inductive element in the first mode; and
    a plurality of auxiliary circuits that are each configured to adjust, in response to being enabled, an amplitude of the output signal by changing the transconductance gain provided to the oscillator circuit; and
    a calibration circuit configured to detect an amplitude of the output signal, and adjust, in response to the detected amplitude, how many of the plurality of auxiliary circuits are enabled.

2. The device of claim 1, wherein the calibration circuit is further configured to adjust the amplitude of the output signal based upon a difference between the detected amplitude of the output signal and an amplitude of the charge voltage.

3. The device of claim 1, wherein the calibration circuit is further configured to set, before entering the second mode, how many of the plurality of auxiliary circuits are enabled based upon a value for a frequency control word (FCW) of the frequency synthesizer device.

4. The device of claim 3, wherein the calibration circuit is further configured to enable all of the auxiliary circuits in response to the value for the FCW indicating that the frequency synthesizer device is operating in a lower band (LB) and to enable only half of the auxiliary circuits in response to the FCW indicating that the frequency synthesizer device is operating in a higher band (HB).

5. The device of claim 1, wherein the calibration circuit is further configured to determine whether the amplitude of the output signal is within a threshold range defined by low and high threshold voltages.

6. The device of claim 5, further comprising a peak detector circuit configured to generate first and second peak detector output signals that are both referenced to a third peak detector output signal.

7. The device of claim 6, further comprising finite state machines for outer and inner loops that are configured to control timing for the enablement of the peak detector circuit.

8. A method for use with frequency synthesizer device with amplitude control, the method comprising:

applying, using switch circuit operating in a first mode, a charge voltage to an oscillator circuit having:
an inductive-capacitive (LC) tank circuit having:
a capacitive element, and
an inductive element that is connected to the capacitive element;
enabling, using the switch circuit operating in a second mode, the LC tank circuit to oscillate;
reinforcing, using driver circuits that are response to a voltage applied to the tank circuit, current in the LC tank, the reinforcement based upon a transconductance gain of the driver circuits;
detecting, using a calibration circuit, an amplitude of an output signal from the oscillator circuit; and
adjusting, in response to the detected amplitude, the transconductance gain by enabling or disabling auxiliary circuits from plurality of auxiliary circuits, wherein adjusting the transconductance gain includes changing an effective width for transistors in the switchable inverter circuits.

9. The method of claim 8, further comprising determining that the detected amplitude of the output the signal is within a voltage range.

10. The method of claim 9, wherein the voltage range is defined by a high threshold voltage and low threshold voltage that are each based upon the charge voltage.

11. The method of claim 8, further comprising adjusting a frequency of oscillation for the oscillator circuit and further adjusting, in response to a second detected amplitude at the adjusted frequency of oscillation, the transconductance gain.

12. The method of claim 11, further comprising further adjusting the frequency of oscillation for the oscillator circuit after the further adjusting of the transconductance gain.

13. The method of claim 8, wherein the auxiliary circuits include transistors that, when enabled, are configured to reinforce the current in the LC tank.

* * * * *